(12) United States Patent
Yamaguchi et al.

(10) Patent No.: US 7,949,484 B2
(45) Date of Patent: May 24, 2011

(54) PROBABILITY DENSITY FUNCTION SEPARATING APPARATUS, PROBABILITY DENSITY FUNCTION SEPARATING METHOD, NOISE SEPARATING APPARATUS, NOISE SEPARATING METHOD, TESTING APPARATUS, TESTING METHOD, CALCULATING APPARATUS, CALCULATING METHOD, PROGRAM, AND RECORDING MEDIUM

(75) Inventors: Takahiro Yamaguchi, Tokyo (JP); Harry Hou, Santa Clara, CA (US); Dave Armstrong, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 1050 days.

(21) Appl. No.: 11/688,877

(22) Filed: Mar. 21, 2007

(65) Prior Publication Data

US 2009/0326845 A1 Dec. 31, 2009

Related U.S. Application Data

(60) Provisional application No. 60/783,820, filed on Mar. 21, 2006.

(51) Int. Cl.
*G06F 19/00* (2006.01)
(52) U.S. Cl. ........................................... 702/76
(58) Field of Classification Search .................... 702/76, 702/77, 182–185; 324/533, 534; 714/25
See application file for complete search history.

(56) References Cited

U.S. PATENT DOCUMENTS

| 2002/0120420 A1 | 8/2002 | Wilstrup et al. |
| 2003/0115017 A1 | 6/2003 | Sun et al. |
| 2005/0027477 A1 | 2/2005 | Li et al. |
| 2006/0206315 A1* | 9/2006 | Hiroe et al. .................. 704/203 |

FOREIGN PATENT DOCUMENTS

| JP | 2002-502041 | 1/2002 |
| JP | 2003057280 | 2/2003 |
| JP | 2004-125552 A | 4/2004 |
| JP | 2005513841 | 5/2005 |

OTHER PUBLICATIONS

Office action issued by the German Patent and Trademark Office on Apr. 14, 2010 which cites U.S. Patent Application Publication No. 1 above.
Li et al., A New Method for Jitter Decomposition Through Its Distribution Tail Fitting, ITC International Test Conference, Paper 302, 1999 IEEE, p. 788-p. 794.
Hansel et al., Implementation of an Economic Jitter Compliance Test for a Multi-Gigabit Device on ATE, ITC International Test Conference, Paper 46.2, 2004 IEEE, p. 1303-p. 1312.
Office Action in U.S. Appl. No. 11/836,784 mailed Jan. 3, 2011 (10 pages).

\* cited by examiner

*Primary Examiner* — Edward Raymond
(74) *Attorney, Agent, or Firm* — Osha • Liang LLP

(57) ABSTRACT

There is provided a probability density function separating apparatus that separates a predetermined component in a given probability density function, including: a domain transforming section that is supplied with the probability density function and transforms the probability density function into a spectrum in a frequency domain; and a standard deviation computing section that computes standard deviation of a random component included in the probability density function based on the spectrum.

62 Claims, 27 Drawing Sheets

| Bench-marking | Expected Values [d] | | Conventional Method | Proposed Method |
|---|---|---|---|---|
| SJ*SmallSJ | DJ | 50 ps | — | 49.0 ps |
| SJ*SJ | DJ | 100 ps | 80.5 ps | 99.0 ps |
| | Number of DJ? | | Impossible | Possible |
| | Number of DJ | 2 | — | 2 |

FIG. 16

| Bench-marking | Expected Values [c] | | Conventional Method | Proposed Method |
|---|---|---|---|---|
| RJ only | DJ | 0.00 ps | 0.00 ps | 0.00 ps |
| | RJ | 4.02 ps | 4.54 ps rms | 3.82 ps rms |
| RJ&SJ | DJ | 50 ps | 44.5 ps | 51.2 ps |
| | RJ | 4.02 ps | 4.89 ps rms | 3.72 ps rms (3.72 ps rms) |
| RJ&SJ with Timing Error | DJ | 50 ps | 44.9 ps | 51.2 ps |
| | RJ | 4.02 ps | 4.78 ps rms | 3.58 ps rms (3.67 ps rms) |

FIG. 24

PROBABILITY DENSITY FUNCTION SEPARATING APPARATUS, PROBABILITY DENSITY FUNCTION SEPARATING METHOD, NOISE SEPARATING APPARATUS, NOISE SEPARATING METHOD, TESTING APPARATUS, TESTING METHOD, CALCULATING APPARATUS, CALCULATING METHOD, PROGRAM, AND RECORDING MEDIUM

CROSS REFERENCE TO RELATED APPLICATION

The present application claims priority from a U.S. Provisional Application(s) No. 60/783,820 filed on Mar. 21, 2006, the contents of which are incorporated herein by reference.

BACKGROUND OF THE INVENTION

1. Field of the Invention

The present invention relates to a probability density function separating apparatus, a probability density function separating method, a noise separating apparatus, a noise separating method, a testing apparatus, a testing method, a calculating apparatus, a calculating method, a program, and a recording medium. More particularly, the present invention relates to an apparatus and a method for separating a deterministic component and a random component from a probability density function.

2. Related Art

A method for separating a probability density function with a deterministic component and a probability density function with a random jitter component can be used in an oscilloscope, a time interval analyzer, a universal time frequency counter, automated test equipment, a spectrum analyzer, a network analyzer, and so on. A signal under measurement may be an electrical signal or an optical signal.

When amplitude of the signal under measurement is degraded, a probability by which a reception bit one is erroneously decided to a bit zero is increased. Similarly, when a timing of the signal under measurement is degraded, a probability of an erroneous decision is increased in proportion to the degradation. It takes longer observation time than $T_b/P_e$ to measure these bit error rates $P_e$ (however, $T_b$ shows a bit rate). As a result, it takes long measurement time to measure an extremely small bit error rate.

For this reason, as measures against amplitude degradation, there has been used a method for setting a bit decision threshold value to a comparatively large value to measure a bit error rate and extrapolate it into an area with an extremely small bit error rate. A deterministic component of a probability density function is bounded and causes a bounded bit error rate. On the other hand, a random component of a probability density function is unbounded. Therefore, a technique for accurately separating a deterministic component and a random component included in measured probability density function and causing bit error rate becomes important.

Conventionally, as a method for separating a deterministic component and a random component included in a probability density function or the like, for example, the invention disclosed in US 2002/0120420 has been known. According to this method, an estimate of variance of a probability density function over a predetermined the interval is computed and the computed estimate of variance is transformed into a frequency domain, in order to determine a random component and a period component constituting the variance. The method uses changing a measured time interval from one cycle to N cycles to measure an autocorrelation function of a period component and an autocorrelation function of a random component and making the Fourier transform respectively correspond to a line spectrum and a white noise spectrum. Here, the variance is a sum of a correlation coefficient of a period component and a correlation coefficient of a random component.

However, a probability density function is given by convolution integrating a deterministic component and a random component. Therefore, according to this method, it is not possible to separate a deterministic component and a random component from a probability density function.

Moreover, as another method for separating a deterministic component and a random component included in a probability density function or the like, for example, the invention disclosed in US2005/0027477 has been known. As shown in FIG. 2 to be described below, according to this method, both tails of a probability density function are fitted to Gaussian distribution in order to separate two random components from the probability density function. In this method, random components and a deterministic component are performed fit of Gaussian curves under the assumption that both components do not interfere with each other, in order to separate a random component corresponding to Gaussian distribution.

However, it is generally difficult to uniquely determine a boundary between a random component and a deterministic component, and it is difficult to separate a random component with high precision in this method. Moreover, as shown in FIG. 2 to be described below, according to this method, a deterministic component is computed based on a difference $D(\delta\delta)$ between two time instants corresponding to a mean value of each random component.

However, for example, when a deterministic component is a sine wave or the like, it is experimentally confirmed that this difference $D(\delta\delta)$ shows a smaller value than $D(p\text{-}p)$ of a true value. In other words, according to this method, since only an ideal deterministic component by a square wave can be approximated, various deterministic components such as a deterministic component of a sine wave are not measured. Furthermore, a measurement error of a random component is also large.

Moreover, about a probability density function of which a plurality of deterministic components are convolution integrated, a method by which each component can be separated from the function does not exist.

SUMMARY

Therefore, it is an object of the present invention to provide a probability density function separating apparatus, a probability density function separating method, a noise separating apparatus, a noise separating method, a testing apparatus, and a testing method that can solve the foregoing problems. The above and other objects can be achieved by combinations described in the independent claims. The dependent claims define further advantageous and exemplary combinations of the present invention.

That is, according to the first aspect of the present invention, there is provided is a probability density function separating apparatus that separates a predetermined component in a given probability density function, including: a domain transforming section that is supplied with the probability density function and transforms the probability density function into a spectrum in a frequency domain; and a standard deviation computing section that computes standard deviation of a random component included in the probability density function based on the spectrum.

The standard deviation computing section may compute the standard deviation based on a level of a predetermined frequency component of the spectrum.

The standard deviation computing section may compute the standard deviation based on a difference between a level of a first frequency component and a level of a second frequency component of the spectrum.

The standard deviation computing section may compute the standard deviation based on a difference between a level of a predetermined frequency component of the spectrum and a level of a predetermined frequency component of a spectrum obtained by transforming a deterministic component included in the given probability density function into a frequency domain.

The probability density function separating apparatus may further include a random component computing section that computes a probability density function with a random component based on the standard deviation.

The standard deviation computing section may compute the standard deviation in a time domain based on the spectrum in the frequency domain.

The random component computing section may compute the probability density function in a time domain with the random component, based on the standard deviation.

The standard deviation computing section may detect the standard deviation in the frequency domain based on the spectrum in a frequency domain, and computes the standard deviation in a time domain based on the detected standard deviation in a frequency domain.

The standard deviation computing section may compute the standard deviation in a frequency domain based on the spectrum in a frequency domain, and the random component computing section may compute the probability density function in a frequency domain with the random component, based on the standard deviation in a frequency domain.

The random component computing section may compute the probability density function in a time domain with the random component, based on the probability density function in a frequency domain with the random component.

The random component computing section may include: a frequency domain computing section that computes the probability density function in a frequency domain with the random component; and a time domain computing section that computes the probability density function in a time domain with the random component, by a) obtaining a function in a time domain from a real sequence of which a real part is the probability density function in a frequency domain with the random component and an imaginary part is zero, and b) extracting the square root of a sum of a square of the real part and a square of the imaginary part of the function in a time domain.

The time domain computing section may include: a complex sequence computing section that is supplied with the probability density function in a frequency domain with the random component and computes the real sequence based on the probability density function; and an inverse Fourier transform section that is supplied with the real sequence and supplies the real sequence to the time domain computing section.

The probability density function separating apparatus may further include: a peak to peak value detecting section that detects a peak to peak value of the probability density function based on the spectrum; and a deterministic component computing section that computes a deterministic component of the given probability density function, based on the peak to peak value.

The peak to peak value detecting section may detect the peak to peak value based on at least one null frequency of nulls that have the smallest absolute values of frequency selected from among a plurality of nulls included in the spectrum.

The peak to peak value detecting section may compute the peak to peak value based on a difference in frequency between any two nulls included in the spectrum.

The deterministic component computing section may compute a probability density function with a deterministic component in a time domain based on the peak to peak value.

The probability density function separating apparatus may further include a synthesizing section that generates a composite probability density function obtained by convolving the probability density function with the random component computed by the random component computing section and the probability density function with the deterministic component computed by the deterministic component computing section.

The deterministic component computing section may compute the deterministic component corresponding to each peak to peak value when sequentially changing peak to peak values using the peak to peak value detected by the peak to peak value detecting section as a reference, and the synthesizing section may sequentially generate a composite probability density function obtained by sequentially synthesizing a probability density function with each deterministic component and the probability density function with the random component, and the probability density function separating apparatus may further include: a comparing section that compares each composite probability density function and the given probability density function, and selects either of the peak to peak values based on the comparison result.

The peak to peak value detecting section may compute the peak to peak value with predetermined measurement resolution, and the deterministic component computing section may compute the deterministic component corresponding to each peak to peak value in the case of sequentially changing the peak to peak values in a range according to the measurement resolution.

It is possible that the deterministic component computing section is previously supplied with a function of which the peak to peak value is unknown, substitutes the peak to peak value detected by the peak to peak value detecting section into the function, and computes the probability density function with the deterministic component.

It is also possible that the deterministic component computing section is previously supplied with a plurality of functions according to the type of distribution of the deterministic component, substitutes the peak to peak value detected by the peak to peak value detecting section into each function, and respectively computes the probability density function for each type of distribution of a deterministic component.

The probability density function separating apparatus may further include: a synthesizing section that generates each composite probability density function obtained by convolving a probability density function of the random component computed by the random component computing section and each probability density function computed by the deterministic component computing section; and a comparing section that compares each composite probability density function and the given probability density function, where the deterministic component computing section selects either of the respective probability density functions of the deterministic component based on the comparison result of the comparing section.

The probability density function separating apparatus may further include: a peak to peak value detecting section that compares respective probability densities of the given probability density function and a predetermined threshold value, detects a point where a magnitude relation between the respective probability densities and the predetermined threshold value changes, and detects a peak to peak value of the given probability density function based on the detected point; and a deterministic component computing section that computes a deterministic component of the given probability density function based on the peak to peak value.

It is possible that the peak to peak value detecting section sequentially changes the threshold value, detects the peak to peak value for respective threshold values, and selects either of the respective threshold values based on the change in the peak to peak value for the change in the threshold value.

It is also possible that the peak to peak value detecting section compares the respective probability densities and the threshold value from both ends to a central portion of the given probability density function, and detects, to be the detected point, a point where the probability density becomes the threshold value or above from below the threshold value.

The probability density function separating apparatus may further include: a deterministic component computing section that compares a predetermined spectrum to a spectrum obtained by raising a spectrum in a frequency domain of the given probability density function to $\beta$th power, and computes a number of deterministic components included in the given probability density function based on the comparison result.

It is possible that the deterministic component computing section detects $\beta$ of which each spectrum is substantially equal by sequentially changing the $\beta$, and computes an inverse of the detected $\beta$ as the number of the deterministic components.

According to the second aspect of the present invention, there is provided is a probability density function separating apparatus that separates a predetermined component in a given probability density function, including: a domain transforming section that is supplied with the probability density function, and transforms the probability density function into a spectrum in a frequency domain; and a peak to peak value detecting section that detects a peak to peak value of the probability density function based on the spectrum.

The probability density function separating apparatus may further include: a deterministic component computing section that computes a deterministic component of the given probability density function, based on the peak to peak value.

According to the third aspect of the present invention, there is provided is a probability density function separating method for separating a predetermined component in a given probability density function, including: transforming the probability density function into a spectrum in a frequency domain, by being supplied with the probability density function; and computing standard deviation of a random component included in the probability density function based on the spectrum.

According to the fourth aspect of the present invention, there is provided is a probability density function separating method for separating a predetermined component in a given probability density function, including: transforming the probability density function into a spectrum in a frequency domain, by being supplied with the probability density function; and detecting a peak to peak value of the probability density function based on the spectrum.

According to the fifth aspect of the present invention, there is provided is a noise separating apparatus that separates a probability density function with a predetermined noise component from a probability density function of a signal under measurement, including: a domain transforming section that is supplied with the probability density function of the signal under measurement, and transforms the probability density function into a spectrum in a frequency domain; and a standard deviation computing section that computes standard deviation of a random noise component included in the probability density function, based on the spectrum.

According to the sixth aspect of the present invention, there is provided is a noise separating apparatus that separates a probability density function with a predetermined noise component from a probability density function of a signal under measurement, including: a domain transforming section that is supplied with the probability density function of the signal under measurement, and transforms the probability density function into a spectrum in a frequency domain; and a peak to peak value detecting section that detects a peak to peak value of the probability density function, based on the spectrum.

It is possible that the domain transforming section is supplied with a function showing probability by which the signal under measurement is likely to have an edge for each time, as the probability density function of the signal under measurement.

The domain transforming section may be supplied with, for each amplitude value, a probability by which the signal under measurement is likely to have the amplitude value, as the probability density function of the signal under measurement.

The noise separating apparatus may include a signal under measurement measuring section that samples the signal under measurement according to a given sampling signal and computes the probability density function of the signal under measurement; a sampling signal measuring section that measures a probability density function of the sampling signal; and a correction section that corrects a value acquired by the standard deviation computing section or the peak to peak value detecting section, based on the probability density function of the sampling signal.

According to the seventh aspect of the present invention, there is provided is a noise separating method for separating a probability density function with a predetermined noise component from a probability density function of a signal under measurement, including: transforming the probability density function into a spectrum in a frequency domain, by being supplied with the probability density function of the signal under measurement; and computing standard deviation of a random noise component included in the probability density function, based on the spectrum.

According to the eighth aspect of the present invention, there is provided is a noise separating method for separating a probability density function with a predetermined noise component from a probability density function of a signal under measurement, including: transforming the probability density function into a spectrum in a frequency domain, by being supplied with the probability density function of the signal under measurement; and detecting a peak to peak value of the probability density function, based on the spectrum.

According to the ninth aspect of the present invention, there is provided is a test apparatus that tests a device under test, including: a noise separating apparatus that separates a probability density function of a predetermined noise component from a probability density function of a signal under measurement output from the device under test; and a deciding section that decides the good or bad of the device under test based on standard deviation of the predetermined noise component separated by the noise separating apparatus, where the noise separating apparatus includes: a domain transforming section that is supplied with the probability density function of the signal under measurement, and transforms the probability density function into a spectrum in a frequency domain; and a standard deviation computing section that computes standard deviation of a random noise component included in the probability density function, based on the spectrum.

According to the tenth aspect of the present invention, there is provided is a test apparatus that tests a device under test, including: a noise separating apparatus that separates a probability density function of a predetermined noise component from a probability density function of a signal under measurement output from the device under test; and a deciding section that decides the good or bad of the device under test based on standard deviation of the predetermined noise component separated by the noise separating apparatus and a peak to peak value of a deterministic noise component, where the noise separating apparatus includes: a domain transforming section that is supplied with the probability density function of the signal under measurement, and transforms the probability density function into a spectrum in a frequency domain; and a peak to peak value detecting section that detects a peak to peak value of the probability density function, based on the spectrum.

According to the eleventh aspect of the present invention, there is provided is a test method for testing a device under test, including: a noise separating step of separating standard deviation of a predetermined noise component from a probability density function of a signal under measurement output from the device under test; and a deciding step of deciding the good or bad of the device under test based on a probability density function of the predetermined noise component separated in the noise separating step, where the noise separating step includes: transforming the probability density function into a spectrum in a frequency domain, by being supplied with the probability density function of the signal under measurement; and computing standard deviation of a random noise component included in the probability density function, based on the spectrum.

According to the twelfth aspect of the present invention, there is provided is a test method for testing a device under test, including: a noise separating step of separating a probability density function of a predetermined noise component from a probability density function of a signal under measurement output from the device under test; and a deciding step of deciding the good or bad of the device under test based on standard deviation of the predetermined noise component separated in the noise separating step and a peak to peak value of a deterministic noise component, where the noise separating step includes: transforming the probability density function into a spectrum in a frequency domain, by being supplied with the probability density function of the signal under measurement; and detecting a peak to peak value of the probability density function, based on the spectrum.

According to the thirteenth aspect of the present invention, there is provided is a computing apparatus that computes a Gaussian curve in a time domain from a Gaussian curve in a frequency domain, including: a time domain computing section that computes the Gaussian curve in a time domain by a) acquiring a function in a time domain from a real sequence of which a real part is file Gaussian curve in a frequency domain and an imaginary part is zero, and b) extracting the square root of a sum of a square of the real part and a square of the imaginary part of the function in a time domain.

The time domain computing section may include an inverse Fourier transform section that is supplied with the real sequence, converts the real sequence into the function in a time domain, and supplies the function in a time domain to the time domain computing section.

The computing apparatus may further include a complex sequence computing section that is supplied with the Gaussian curve in a frequency domain, computes the real sequence based on the Gaussian curve in a frequency domain, and supplies the real sequence to the inverse Fourier transform section.

The computing apparatus may further include: a frequency domain computing section that is supplied with standard deviation the Gaussian curve in a frequency domain, computes the Gaussian curve of the frequency domain based on the standard deviation, and supplies the Gaussian curve in the frequency domain to the complex sequence computing section.

According to the fourteenth aspect of the present invention, there is provided is a computing method for computing a Gaussian curve in a time domain from a Gaussian curve in a frequency domain, including: computing the Gaussian curve in a time domain by a) acquiring a function in a time domain of a real sequence of which a real part is the Gaussian curve in a frequency domain and an imaginary pant is zero, and b) extracting the square root of a stun of a square of the real part and a square of the imaginary part of the function in a time domain.

According to the fifteenth aspect of the present invention, there is provided is a computing apparatus that computes a waveform in a time domain from a spectrum in a frequency domains including: a time domain computing section that computes the waveform in a time domain by a) acquiring a magnitude spectrum of the frequency domain, and b) transforming the magnitude spectrum into a function in a time domain.

The time domain computing section may compute the waveform in a time domain by extracting the square root of a sum of a square of a real part and a square of an imaginary part of the function in a time domain obtained by transforming the magnitude spectrum.

The time domain computing section may be supplied with a continuously changing spectrum as the magnitude spectrum of the frequency domain.

The time domain computing section may be supplied with a spectrum of a Gaussian curve as the magnitude spectrum of the frequency domain.

The computing apparatus may further include: a frequency domain measuring section that detects the magnitude spectrum of a given signal under measurement, and supplies the magnitude spectrum to the time domain computing section, where the time domain computing section computes a waveform in a time domain of the signal under measurement.

According to the sixteenth aspect of the present invention, there is provided is a computing method for computing a waveform in a time domain from a spectrum in a frequency domain, including: computing the waveform in a time domain by a) acquiring a magnitude spectrum of the frequency domain, and b) transforming the magnitude spectrum into a function in a time domain.

According to the seventeenth aspect of the present invention, there is provided is a program that causes, to function, a probability density function separating apparatus that separates a predetermined component in a given probability density function, the program causing the probability density function separating apparatus to function as: a domain transforming section that is supplied with the probability density function and transforms the probability density function into a spectrum in a frequency domain; and a standard deviation computing section that computes standard deviation of a random component included in the probability density function based on the spectrum.

According to the eighteenth aspect of the present invention, there is provided is a recording medium storing therein a program that causes, to function, a probability density function separating apparatus that separates a predetermined component in a given probability density function, the program causing the probability density function separating apparatus to function as: a domain transforming section that is supplied with the probability density function and transforms the probability density function into a spectrum in a frequency domain; and a standard deviation computing section that computes standard deviation of a random component included in the probability density function based on the spectrum.

According to the nineteenth aspect of the present invention, there is provided is a program that causes, to function, a probability density function separating apparatus that separates a predetermined component in a given probability density function, the program causing the probability density function separating apparatus to function as: a domain transforming section that is supplied with the probability density function and transforms the probability density function into a spectrum in a frequency domain; a peak to peak value detecting section that detects a peak to peak value of the probability density function based on the spectrum; and a deterministic component computing section that computes a deterministic component of the given probability density function, based on the peak to peak value.

According to the twentieth aspect of the present invention, there is provided is a recording medium storing therein a program that causes, to function, a probability density function separating apparatus that separates a predetermined component in a given probability density function, the program causing the probability density function separating apparatus to function as: a domain transforming section that is supplied with the probability density function and transforms the probability density function into a spectrum in a frequency domain; a peak to peak value detecting section that detects a peak to peak value of the probability density function based on the spectrum; and a deterministic component computing section that computes a deterministic component of the given probability density function, based on the peak to peak value.

According to the twenty-first aspect of the present invention, there is provided is a program that causes, to function, a noise separating apparatus that separates a probability density function with a predetermined noise component from a probability density function of a signal under measurement, the program causing the noise separating apparatus to function as: a domain transforming section that is supplied with the probability density function of the signal under measurement, and transforms the probability density function into a spectrum in a frequency domain; and a standard deviation computing section that computes standard deviation of a random noise component included in the probability density function, based on the spectrum.

According to the twenty-second aspect of the present invention, there is provided is a recording medium storing therein a program that causes, to function, a noise separating apparatus that separates a probability density function with a predetermined noise component from a probability density function of a signal under measurement, the program causing the noise separating apparatus to function as: a domain transforming section that is supplied with the probability density function of the signal under measurement, and transforms the probability density function into a spectrum in a frequency domain; and a standard deviation computing section that computes standard deviation of a random noise component included in the probability density function, based on the spectrum.

According to the twenty-third aspect of the present invention, there is provided is a program that causes, to function, a noise separating apparatus that separates a probability density function with a predetermined noise component from a probability density function of a signal under measurement, the program causing the noise separating apparatus to function as: a domain transforming section that is supplied with the probability density function of the signal under measurement, and transforms the probability density function into a spectrum in a frequency domain; a peak to peak value detecting section that detects a peak to peak value of the probability density function based on the spectrum; and a deterministic component computing section that computes a probability density function of a deterministic noise component, based on the peak to peak value.

According to the twenty-fourth aspect of the present invention, there is provided is a recording medium storing therein a program that causes, to function, a noise separating apparatus that separates a probability density function with a predetermined noise component from a probability density function of a signal under measurement, the program causing the noise separating apparatus to function as: a domain transforming section that is supplied with the probability density function of the signal under measurement, and transforms the probability density function into a spectrum in a frequency domain; A peak to peak value detecting section that detects a peak to peak value of the probability density function based on the spectrum; and a deterministic component computing section that computes a probability density function of a deterministic noise component, based on the peak to peak value.

According to the twenty-fifth aspect of the present invention, there is provided is a program that causes, to function, a computing apparatus that computes a Gaussian curve in a time domain from a Gaussian curve in a frequency domain, the program causing the computing apparatus to function as: a time domain computing section that computes the Gaussian curve in a time domain by a) acquiring a function in a time domain from a real sequence of which a real part is the Gaussian curve in a frequency domain and an imaginary part is zero, and b) extracting the square root of a sum of a square of the real part and a square of the imaginary part of the function in a time domain.

According to the twenty-sixth aspect of the present invention, there is provided is a recording medium storing therein a program that causes, to function, a computing apparatus that computes a Gaussian curve in a time domain from a Gaussian curve in a frequency domain, the program causing the computing apparatus to function as: a time domain computing section that computes the Gaussian curve in a time domain by a) acquiring a function in a time domain from a real sequence of which a real part is the Gaussian curve in a frequency domain and an imaginary part is zero, and b) extracting the square root of a sum of a square of the real part and a square of the imaginary part of the function in a time domain.

According to the twenty-seventh aspect of the present invention, there is provided is a program that causes, to function, a computing apparatus that computes a waveform in a time domain from a spectrum in a frequency domain, the program causing the computing apparatus to function as: a time domain computing section that computes the waveform in a time domain by a) acquiring a magnitude spectrum of the frequency domain, and b) transforming the magnitude spectrum into a function in a time domain.

According to the twenty-eighth aspect of the present invention, there is provided is a recording medium storing therein a program that causes, to function, a computing apparatus that computes a waveform in a time domain from a spectrum in a frequency domain, the program causing the computing apparatus to function as: a time domain computing section that computes the waveform in a time domain by a) acquiring a magnitude spectrum of the frequency domain, and b) transforming the magnitude spectrum into a function in a time domain.

The summary of the invention does not necessarily describe all necessary features of the present invention. The present invention may also be a sub-combination of the features described above.

BRIEF DESCRIPTION OF THE DRAWINGS

FIG. 16 shows values of D(p-p) measured by a threshold process and D($\delta\beta$) measured by a conventional method for a probability density function including a plurality of deterministic jitters.

FIG. 24 is a view exemplary showing a measurement result of jitter by a noise separating apparatus 200 and a measurement result of jitter by a conventional method.

FIG. 26A shows an input PDF and FIG. 26B shows a probability density function obtained by convolving a deterministic component and a random component separated using the probability density function separating apparatus 100.

DESCRIPTION OF EXEMPLARY EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
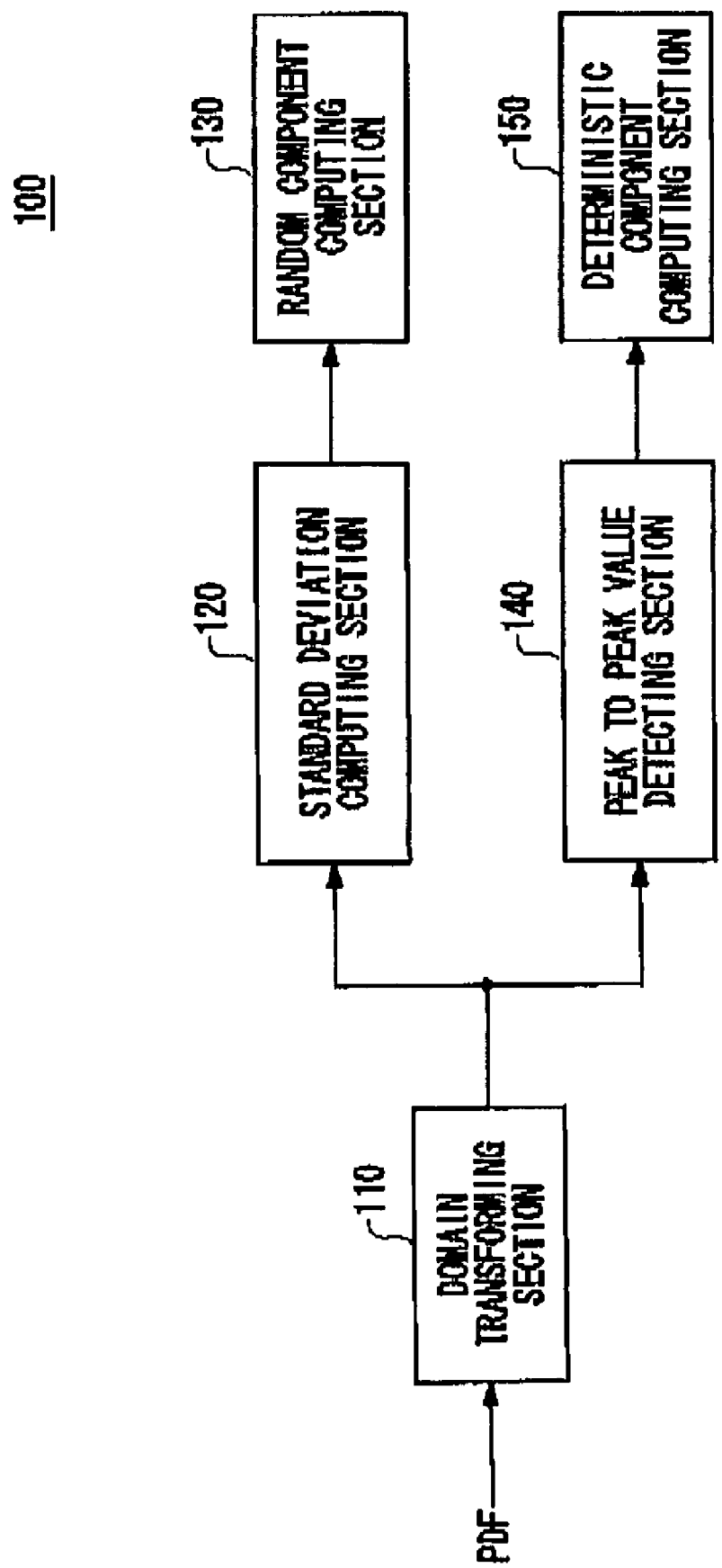
FIG. 1 is a view exemplary showing configurations of a probability density function separating apparatus 100 according to an embodiment of the present invention.

FIG. 1 is a view exemplary showing configurations of a probability density function separating apparatus 100 according to an embodiment of the present invention. The probability density function separating apparatus 100 is an apparatus that separates a predetermined component from a given probability density function, and includes an domain transforming section 110, a standard deviation computing section 120, a random component computing section 130, a peak to peak value detecting section 140, and a deterministic component computing section 150. The probability density function separating apparatus 100 according to the present example separates a random component and a deterministic component from a given probability density function (hereinafter, referred to as an input PDF). Moreover, the probability density function separating apparatus 100 may separate either of a random component or a deterministic component from an input PDF. In this case, the probability density function separating apparatus 100 may have either combination of the standard deviation computing section 120 and the random component computing section 130 or the peak to peak value detecting section 140 and the deterministic component computing section 150.

The domain transforming section 110 is supplied with an input PDF, and transforms the input PDF into a spectrum of a frequency domain. For example, an input PDF may be a function showing probability by which a predetermined signal is likely to have an edge for each of timing. In this case, the probability density function separating apparatus 100 separates a random jitter component and a deterministic jitter component included in this signal.

Moreover, the domain transforming section 110 may compute a spectrum of a frequency domain by performing Fourier transform on the input PDF. Moreover, an input PDF may be digital data, and the domain transforming section 110 may have means for transforming an input PDF with an analog signal into a digital signal.

The standard deviation computing section 120 computes standard deviation of a random component included in the input PDF based on a spectrum output from the domain transforming section 110. Since the random component included in the input PDF follows Gaussian distribution, the standard deviation computing section 120 computes standard deviation of this Gaussian distribution. A concrete computation method will be below described in FIGS. 2 to 7.

The random component computing section 130 computes a probability density function of a random component based on the standard deviation computed from the standard deviation computing section 120. For example, according to the probability density function separating apparatus 100 in the present example as described below in FIGS. 2 to 7, it is possible to uniquely determine a random component (Gaussian distribution) included in the input PDF based on the standard deviation. The random component computing section 130 may output Gaussian distribution based on standard deviation or may output this standard deviation. Moreover, the random component computing section 130 may output this Gaussian distribution or this standard deviation in a time domain.

The peak to peak value detecting section 140 detects a peak to peak value of the input PDF based on the spectrum output from the domain transforming section 110. A concrete computation method will be below described in FIGS. 2 to 7.

The deterministic component computing section 150 computes a deterministic component of the input PDF based on the peak to peak value detected from the peak to peak value detecting section 140. A concrete computation method will be below described in FIGS. 2 to 7. The deterministic component computing section 150 may output a probability density function with a deterministic component in a time domain, or may output tins peak to peak value.

Figure 2:
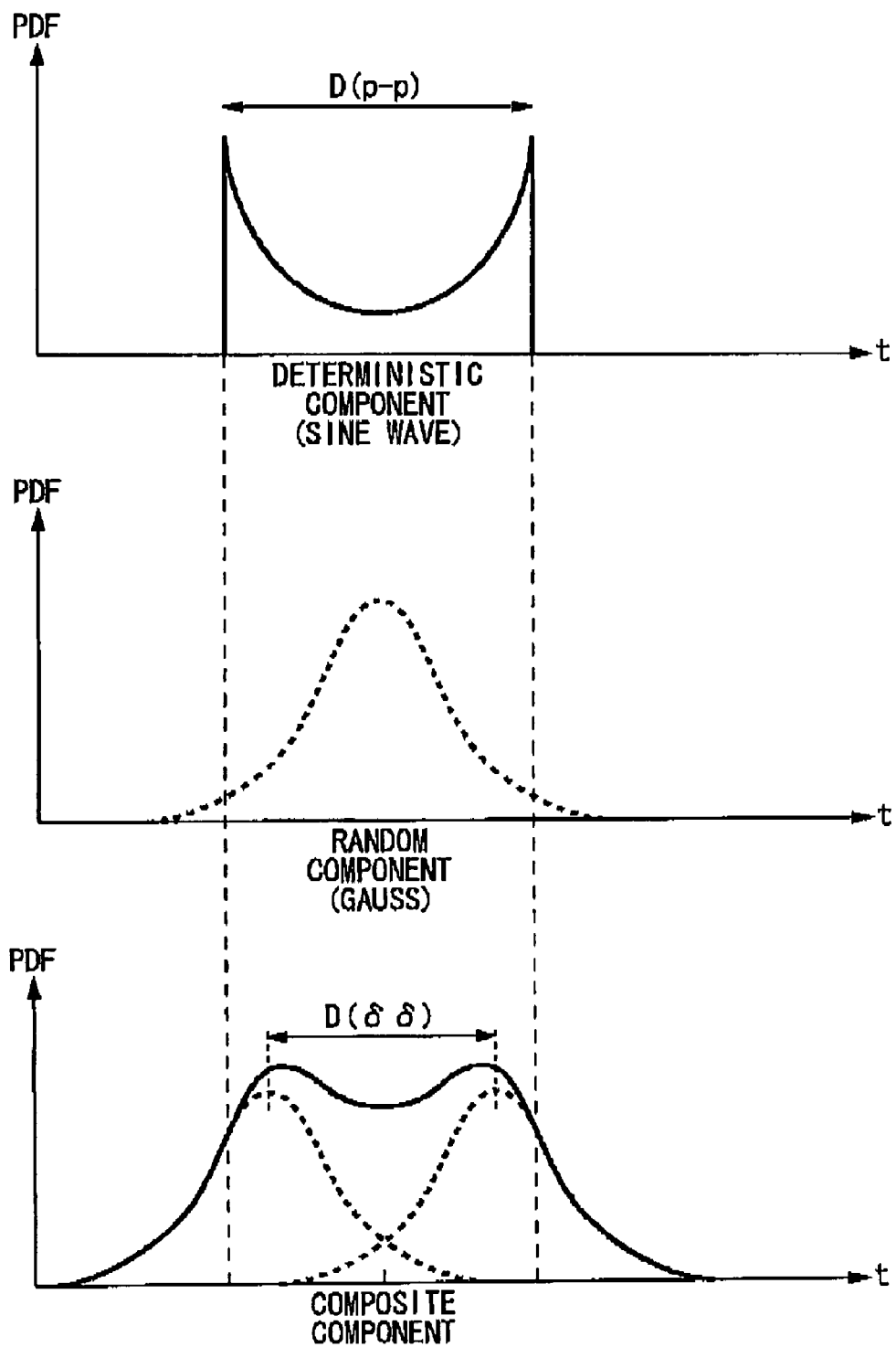
FIG. 2 is a view exemplary showing a waveform of an input PDF.

FIG. 2 is a view exemplary showing a waveform of an input PDF. In the present example, an input PDF includes a probability density function of a sine wave as a deterministic component. However, a deterministic component included in the input PDF is not limited to a sine wave. A deterministic component may be a probability density function with uniform distribution, triangular distribution, a probability density function with a dual Dirac model, a waveform prescribed by the other predetermined function. Moreover, a probability density function with a random component included in the input PDF follows Gaussian distribution.

Moreover, a deterministic component is determined by a peak interval D(p-p) of the probability density function. For example, when a deterministic component is a sine wave, a peak appears at a position according to amplitude of a sine wave in the probability density function. Moreover, when a deterministic component is a square wave, a peak appears at a position according to amplitude of a square wave in the probability density function. Moreover, when a probability density function with a deterministic component is expressed by a dual Dirac model, a deterministic component is defined by an interval D(p-p) between two delta functions.

A composite component (an input PDF) obtained by convolving a deterministic component and a random component is given by a convolution integral of a probability density function with a deterministic component and a probability density function with a random component as shown in FIG. 2. For this reason, a peak interval D(δδ) of a composite component becomes smaller than the peak interval Dip) of a deterministic component. According to a conventional curve fitting method, D(δδ) is detected as a interval between two peaks determining a deterministic component. However, as described above, since D(δδ) becomes a value smaller than D(p-p) of a true value, the separated deterministic component causes an error.

Figure 3:
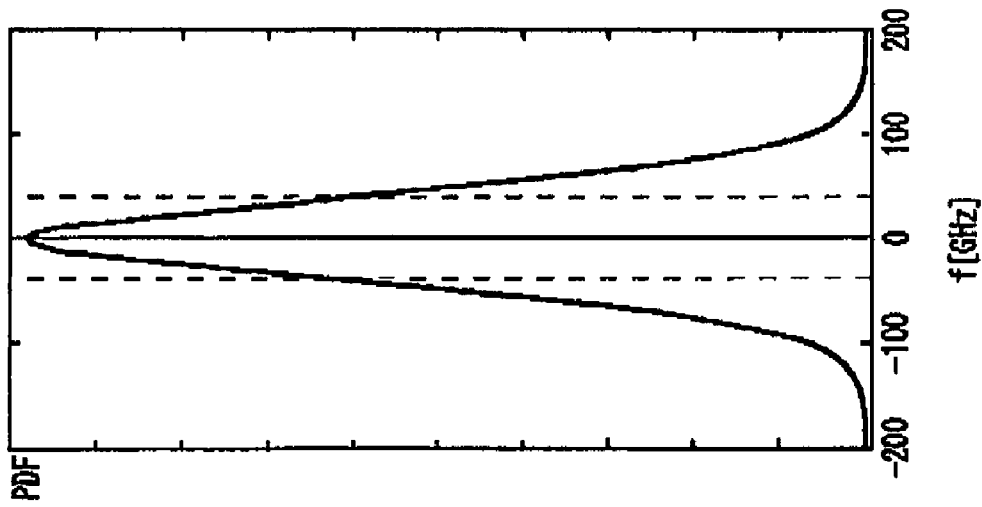
FIG. 3 is a view exemplary showing a probability density function with a random component and a spectrum thereof.
Figure 3:
Figure 3:
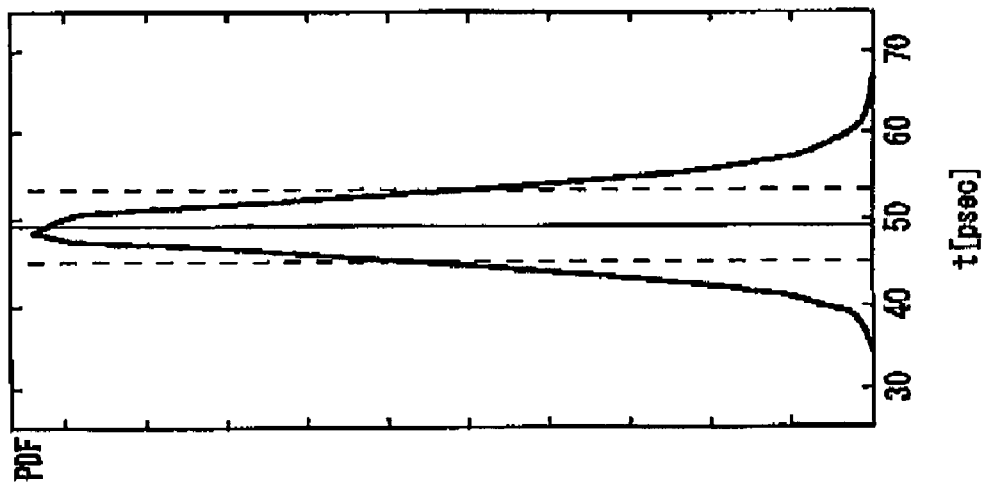

FIG. 3 is a view exemplary showing a probability density function with a random component. A left waveform shown in FIG. 3 shows a probability density function with a random component in a time domain and a right waveform shown in FIG. 3 shows a probability density function with a random component in a frequency domain. A random component p(t) in a time domain is Gaussian distribution and is shown by the following Expression.

$$p(t) = \frac{1}{\sigma\sqrt{2\pi}} e^{-(t-u)^2/(2\sigma^2)}$$ Expression (1)

Here, σ shows standard deviation of Gaussian distribution, u shows time at which Gaussian distribution shows a peak.

Then, a random component P(f) in a frequency domain obtained by performing Fourier transform on the random component p(t) in a time domain is shown by the following Expression.

$$P(f) = Ce^{-f^2/2\sigma^2}$$ Expression (2)

As shown in Expression (2), the result obtained by performing Fourier transform on Gaussian distribution also shows Gaussian distribution. At this time, Gaussian distribution in a frequency domain has a peak at zero frequency.

Figure 4:
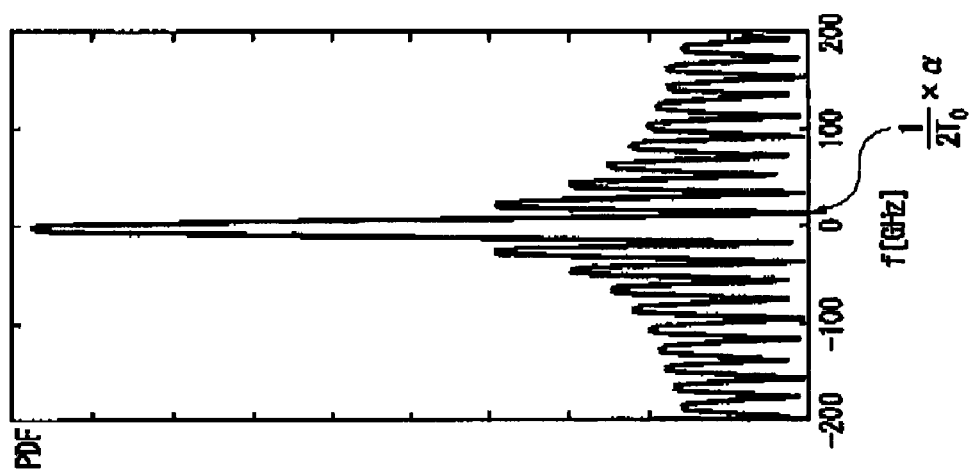
FIG. 4 is a view exemplary showing a probability density function with a deterministic component and a spectrum thereof.
Figure 4:
Figure 4:

FIG. 4 is a view exemplary showing a probability density function with a deterministic component. A left waveform shown in FIG. 4 shows a probability density function with a deterministic component in a time domain and a right waveform shown in FIG. 4 shows a probability density function with a deterministic component in a frequency domain. Moreover, it is assumed that a peak interval of a probability density function with a deterministic component in a time domain is 2 $T_0$.

A spectrum obtained by performing Fourier transform on a waveform in this time domain has a peak (null) in the interval of 1/(2 $T_0$). That is to say, it is possible to obtain a peak interval 2 $T_0$ defining a deterministic component by detecting a null frequency or a peak (null) interval of a spectrum in a frequency domain.

Figure 5:
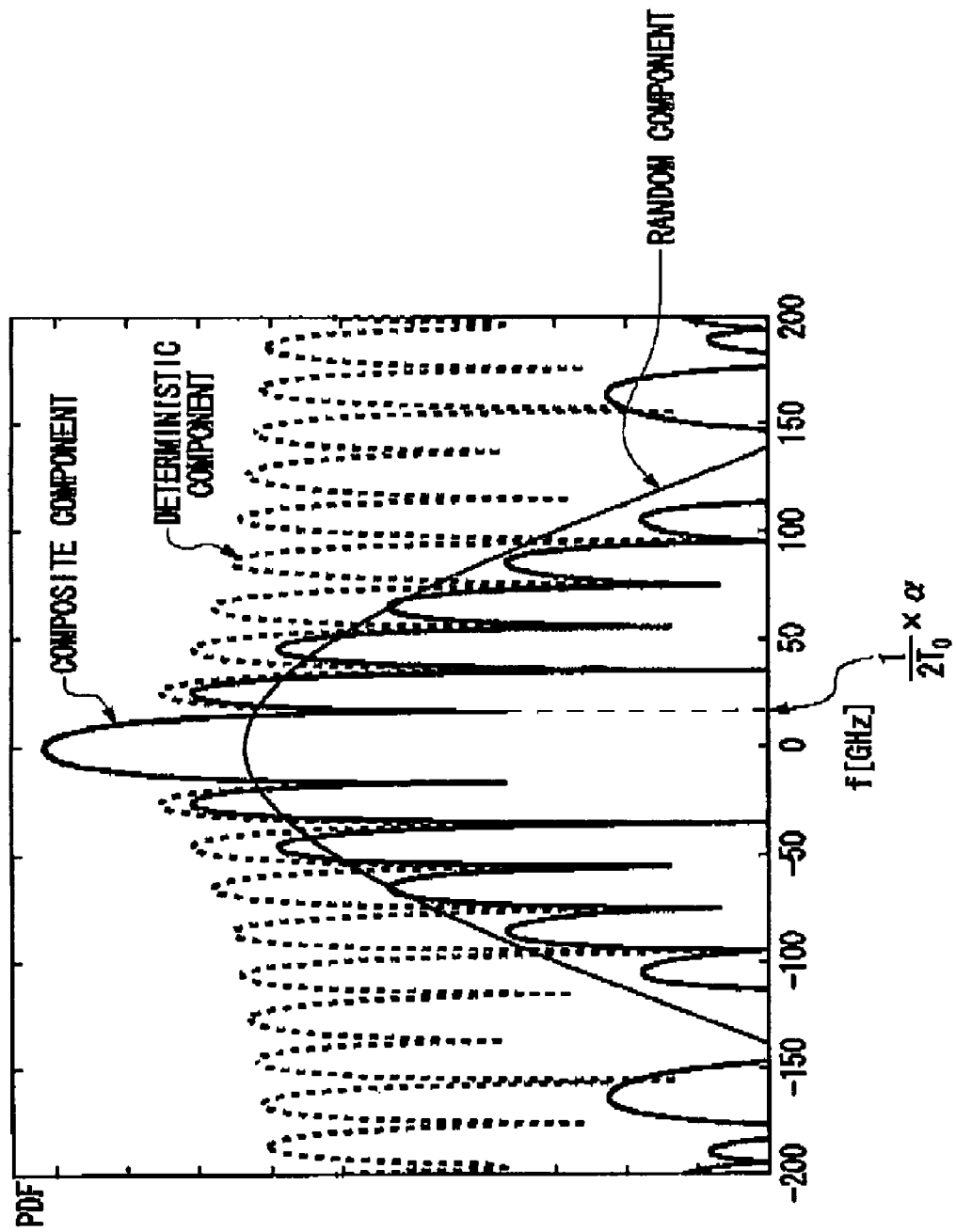
FIG. 5 is a view exemplary showing a spectrum of a probability density function obtained by convolving a deterministic component and a random component.

FIG. 5 is a view exemplary showing a spectrum of a probability density function obtained by convolving a deterministic component and a random component. A function obtained by convolving (a convolution integral) a probability density function with a deterministic component and a probability density function with a random component in a time domain becomes an input PDF. Moreover, a convolution integral in a time domain is multiplication of spectrums in a frequency domain. That is to say, a spectrum of an input PDF is shown by a product of a spectrum of a probability density function with a deterministic component and a spectrum of a probability density function with a random component.

In FIG. 5, a deterministic component is shown with a dashed line and a random component is shown with a Gaussian curve of a solid line. When a random component is multiplied by a deterministic component, each peak spectrum of the deterministic component is attenuated in proportion to loss of a Gaussian curve. For this reason, it is possible to obtain a Gaussian curve that provides a random component in a frequency domain by detecting an input PDF, i.e., a level of predetermined frequency of a spectrum of a composite component.

The standard deviation computing section 120 may compute standard deviation for a Gaussian curve based on the level of the predetermined frequency of the spectrum of the input PDF. The random component computing section 130 may compute a Gaussian curve in a frequency domain as shown in FIG. 5. At this time, as described in FIG. 3, a Gaussian curve in a frequency domain uses zero frequency as a reference. For this reason, the random component computing section 130 can easily compute this Gaussian curve based on the standard deviation computed from the standard deviation computing section 120.

Moreover, as described in FIG. 4, D(p-p)=2 $T_0$ defining a deterministic component can be obtained from the null frequency=1/(2 $T_0$) of the spectrum of the deterministic component. Since a peak to peak value of the spectrum of the deterministic component is preserved even when multiplying a Gaussian curve, a value of D(p-p) can be computed from the null frequency of the spectrum of the input PDF.

The peak to peak value detecting section detects a peak to peak value from the null frequency of the spectrum of the input PDF. For example, the peak to peak value detecting section may detect the peak to peak value based on the null frequency of a null that has the smallest absolute value of frequency from among a plurality of nulls included in the spectrum of the input PDF. The difference between the null frequency and the zero frequency becomes the peak to peak value of the spectrum.

Since a null value of a spectrum is sharply changed in comparison with a peak of a spectrum, it is possible to detect a peak to peak value with high precision. Moreover, as an absolute value of frequency becomes large, null frequency has a large error for a peak to peak value. For this reason, it is possible to detect a peak to peak value with high precision by detecting a peak to peak value based on a null frequency of which an absolute value of the frequency is the smallest. However, when detecting a peak to peak value, it should not be necessarily limited to usage of null frequency of which an absolute value of the frequency is the smallest. For example, a peak to peak value may be detected based on at least one null frequency of a predetermined number of selected nulls that have the smallest absolute values of frequency.

Figure 6:
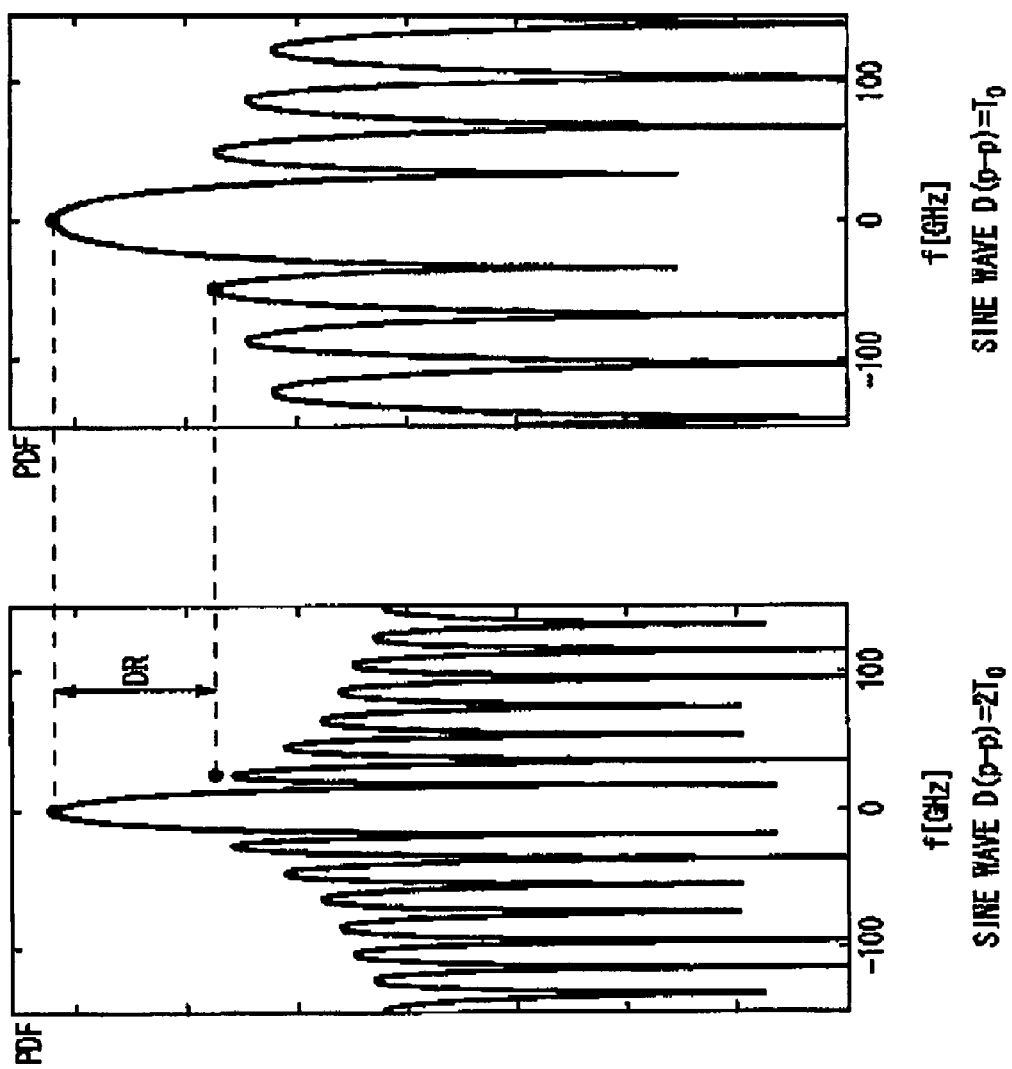
FIG. 6 is a view exemplary showing a spectrum of a deterministic component of which a value of D(p-p) is different.

FIG. 6 is a view exemplary showing a spectrum of a deterministic component of which a value of D(p-p) is different. A left waveform shown in FIG. 6 shows a spectrum in case of D(p-p)=2 $T_0$ and a right waveform shown in FIG. 6 shows a spectrum in case of D(p-p)=$T_0$. Although the value of D(p-p) changes, a difference between a level of a main lobe of zero frequency and a peak level of each side lobe does not change. That is to say, relative level of each spectrum of a probability density function with a deterministic component is uniquely determined according to whether the deterministic component is a sine wave, uniform distribution, triangular distribution, or a dual Dirac model. For this reason, it is possible to obtain a spectrum of a random component by detecting a difference between corresponding peak levels in a spectrum of a deterministic component and a spectrum of an input PDF. Here, it is noted that this level difference depends on attenuation of a spectrum of a deterministic component caused by a random component.

Figure 7:
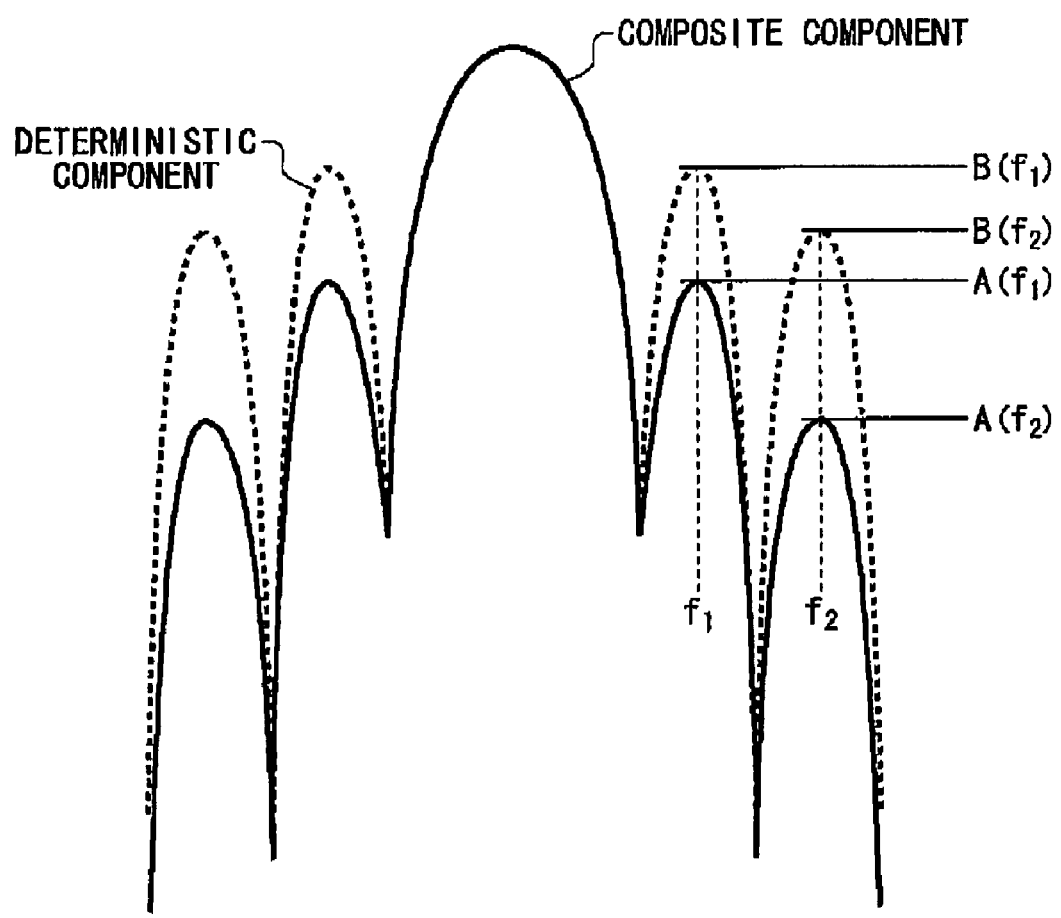
FIG. 7 is a view exemplary explaining a procedure for computing standard deviation of a random component.

FIG. 7 is a view exemplary explaining a method for computing standard deviation of a random component. A Gaussian curve in a frequency domain showing a random component is given by Expression (2). When a base takes a logarithm of e for Expression (2), a quadratic function of f is obtained like Expression (3).

$$\log_e P(f) = \log_e C e^{-f^2/2\sigma^2} \qquad \text{Expression (3)}$$
$$= \log_e C - \frac{f^2}{2\sigma^2}$$

Here, as shown in FIG. 7, it is assumed that frequency of a first peak of a spectrum (a composite component) of an input PDF is f1 and a level is A(f1) and that frequency of a second peak is f2 and a level is A(f2). At this time, a level ratio between the first peak and the second peak is expressed by Expression (4).

$$\log \frac{A(f_2)}{A(f_1)} = \log_e A(f_2) - \log_e A(f_1) \qquad \text{Expression (4)}$$
$$= -\frac{f_2^2 - f_1^2}{2\sigma^2}$$

For this reason, it is possible to compute standard deviation based on a level difference between two frequency components of a spectrum of an input PDF. The standard deviation computing section 120 may compute standard deviation based on a level difference between a first frequency component and a second frequency component of the spectrum of the input PDF. According to Expression (4), precise measurement for dual Dirac is given. Moreover, an approximate solution for other deterministic components is given.

Moreover, it is preferable that these two frequency components are peaks of the spectrum of the input PDF. The standard deviation computing section 120 may compute standard deviation based on a level ratio between any two peaks of the input PDF.

A level of the peak of the spectrum of the input PDF shows resultant attenuation in a peak level of a spectrum of a deterministic component caused by a spectrum of a random component. For this reason, when a level of each peak of the spectrum of the deterministic component is constant, it is possible to compute standard deviation with high precision based on Expression (4). Moreover, when a level of each peak of the spectrum of the deterministic component is not constant the standard deviation computing section 120 may compute standard deviation further based on the level of the peak of the spectrum of the deterministic component. That is to say, the standard deviation computing section 120 may compute standard deviation based on a level difference between a predetermined frequency component of the spectrum of the input PDF and a frequency component corresponding to a spectrum obtained by transforming a probability density function with a deterministic component into a frequency domain. In this case, the standard deviation computing section 120 may compute standard deviation based on Expression (5).

$$-\frac{1}{2\sigma^2} = \frac{1}{f_2^2 - f_1^2} \cdot \log\left(\frac{A(f_2)}{B(f_2)} \Big/ \frac{A(f_1)}{B(f_1)}\right) \quad \text{Expression (5)}$$

For example, a spectrum of a deterministic component can be obtained based on the above-described D(p-p). A deterministic component is determined by a value of D(p-p) as described above and whether the deterministic component is given by a sine wave, uniform distribution, triangular distribution, or dual Dirac. The deterministic component computing section 150 may compute a deterministic component by being previously supplied with a function corresponding to a sine wave, uniform distribution, triangular distribution, dual Dirac, or the like defining the deterministic component and applying a peak to peak value detected from the peak to peak value detecting section 140 to this function. In this case, the random component computing section 130 computes a random component based on the spectrum of the deterministic component computed from the deterministic component computing section 150.

Moreover, assuming that f1=0 in Expression (5), since the level of the spectrum of the input PDF in f1=0 and the level of the spectrum in the deterministic component are equal to each other, Expression (5) is transformed like Expression (6).

$$-\frac{1}{2\sigma^2} = \frac{1}{f_2^2} \cdot \log\left(\frac{A(f_2)}{B(f_2)}\right) \quad \text{Expression (6)}$$

The standard deviation computing section 120 may compute standard deviation based on Expression (6). That is to say, the standard deviation computing section 120 may compute standard deviation based on a level difference between any corresponding peaks in the spectrum of the input PDF and the probability density function with the deterministic component. In this case, it is possible to compute standard deviation by simpler measurement and with high precision.

Moreover, the standard deviation computed based on Expression (5) and Expression (6) is standard deviation of Gaussian distribution in a frequency domain. The standard deviation computing section 120 may compute standard deviation σt in a time domain based on standard deviation σf in a frequency domain. Relation between σf and σt is expressed by Expression (7).

$$\sigma_t = \frac{1}{2\pi}\sqrt{2\sigma_f^2} \quad \text{Expression (7)}$$

In this way, it is possible to compute a probability density function in a time domain of a random component.

It is possible to obtain a Gaussian curve in a frequency domain from Expression (2) by means of σf. A Gaussian curve in a time domain of Expression (I) may be directly obtained by performing Fourier transform on the Gaussian curve in the frequency domain. In other words, a probability density function in a time domain of a random component can be directly obtained from the Gaussian curve in the frequency domain.

Figure 8:
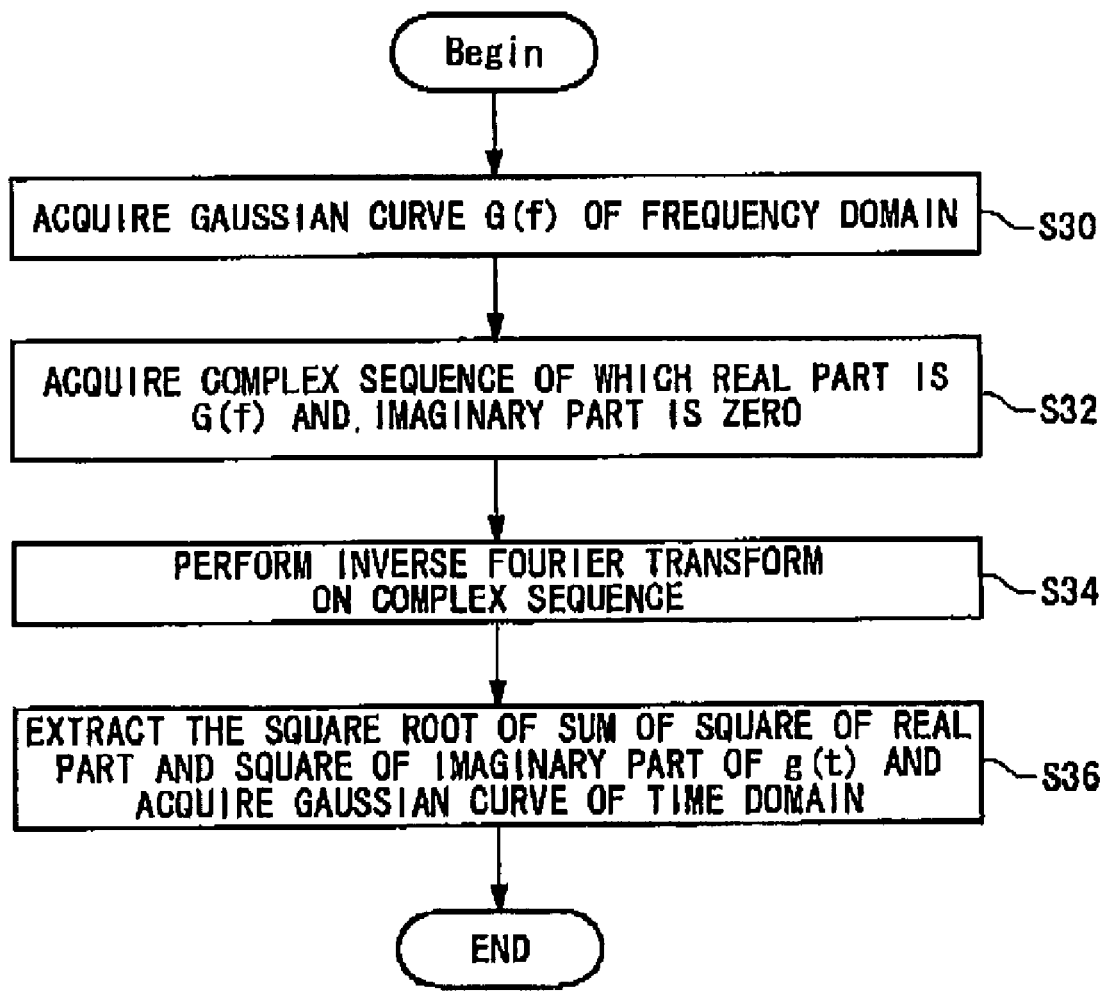
FIG. 8 is a flowchart exemplary showing a method for directly computing a probability density function in a time domain of a random component from a Gaussian curve in a frequency domain.

FIG. 8 is a flowchart exemplary showing a method for directly computing a probability density function in a time domain of a random component from a Gaussian curve in a frequency domain. First, a Gaussian curve G(f) in a frequency domain is acquired by substituting standard deviation of in a frequency domain for Expression (2) (S30). At this time, if required, in order to distribute a Gaussian curve in a time domain around a mean value μ of the input PDF, a result obtained by multiplying exp(j2πμf) by G(f) is used considering time shifting property.

Next, a complex sequence (really, it is noted that it is a real sequence) of which a real part is G(f) and an imaginary part is zero is acquired (S32). Then, a function g(t) in a time domain obtained by performing inverse Fourier transform on the acquired complex sequence is acquired (S34). At this time, since an original signal is a real number, Fourier transform or cosine transform may be performed in place of inverse Fourier transform.

Next, a Gaussian curve in a time domain is acquired by extracting the square root of a stun of a square of a real part and a square of an imaginary part of the g(t) acquired in S34 (S36). In other words, a Gaussian curve in a time domain is acquired by computing a square root of sum of squares of real part and imaginary part of g(t). By such a process, a Gaussian curve in a time domain can be acquired.

Figure 9:
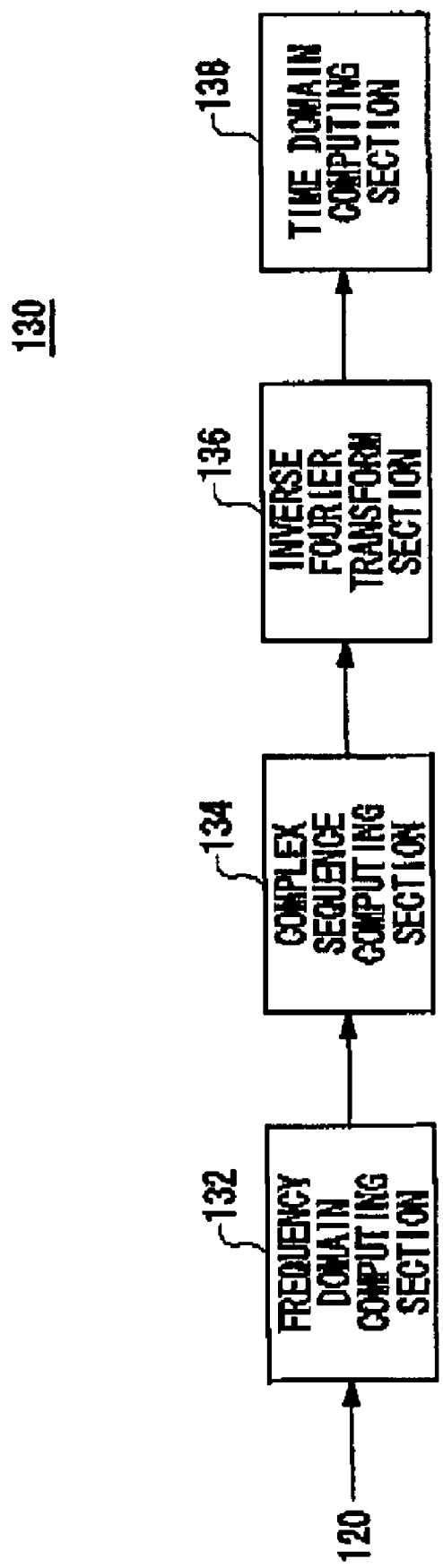
FIG. 9 is a view exemplary showing a configuration of a random component computing section 130.

FIG. 9 is a view exemplary showing a configuration of the random component computing section 130. The random component computing section 130 according to the present example acquires a Gaussian curve in a time domain using a method described in FIG. 8. The random component computing section 130 has a frequency domain computing section 132, a complex sequence computing section 134, an inverse Fourier transform section 136, and a time domain computing section 138.

The frequency domain computing section 132 computes a Gaussian curve G(f) in a frequency domain based on standard deviation of a random component in a frequency domain computed from the standard deviation computing section 120. At this time, the frequency domain computing section 132 may compute a Gaussian curve G(f) in a frequency domain in a manner similar to the step of S30 described in FIG. 8.

The complex sequence computing section 134 computes a complex sequence of which a real part is G(f) and an imaginary part is zero. The inverse Fourier transform section 136 computes a function g(t) in a time domain obtained by performing inverse Fourier transform (or Fourier transform) on this complex sequence. The time domain computing section 138 extracts the square root of sum of squares of real part and imaginary part of the function g(t) in a time domain, and acquires a Gaussian curve in a time domain, that is, a probability density function in a time domain of a random component.

In addition, a process described in FIGS. 8 and 9 is not limited to a process for a probability density function. That is to say, it is possible to suppose a waveform in a time domain from a spectrum in an arbitrary frequency domain by means of a process similar to that described in FIGS. 8 and 9.

In this case, the time domain computing section 138 described in FIG. 9 is supplied with a magnitude spectrum of a signal under measurement. T, the time domain computing section 138 computes a waveform in a time domain by transforming the magnitude spectrum into a function in a time domain. When transforming an magnitude spectrum into a function in a time domain, it is possible to obtain a function in this time domain by applying Fourier transform, inverse Fourier transform, cosine transform or the like to this magnitude spectrum. Then, the time domain computing section 138 can suppose a waveform in a time domain by extracting the square root of sum of squares of real part and imaginary part of this time domain.

In this manner, a computing apparatus for computing a waveform in a time domain from a spectrum in a frequency domain may further include a frequency domain measuring section for detecting a magnitude spectrum of a signal under measurement in addition to the time domain computing section 138. The frequency domain measuring section supplies the detected magnitude spectrum to the time domain computing section 138. By such a configuration it is possible to suppose a waveform in a time domain of a signal under measurement based on only a magnitude spectrum of a signal under measurement.

As described above, according to the probability density function separating apparatus 100 in the present example, it is possible to separate a random component and a deterministic component from a given probability density function with high precision. For example, in case of a random component, it is possible to compute a random component with high precision based on standard deviation computed in a frequency domain without performing an approximation such as conventional curve fitting. Moreover, in case of a deterministic component, it is possible to detect a value Dip) closer to a true value for D(δδ) having an error like a conventional method.

Figure 10:
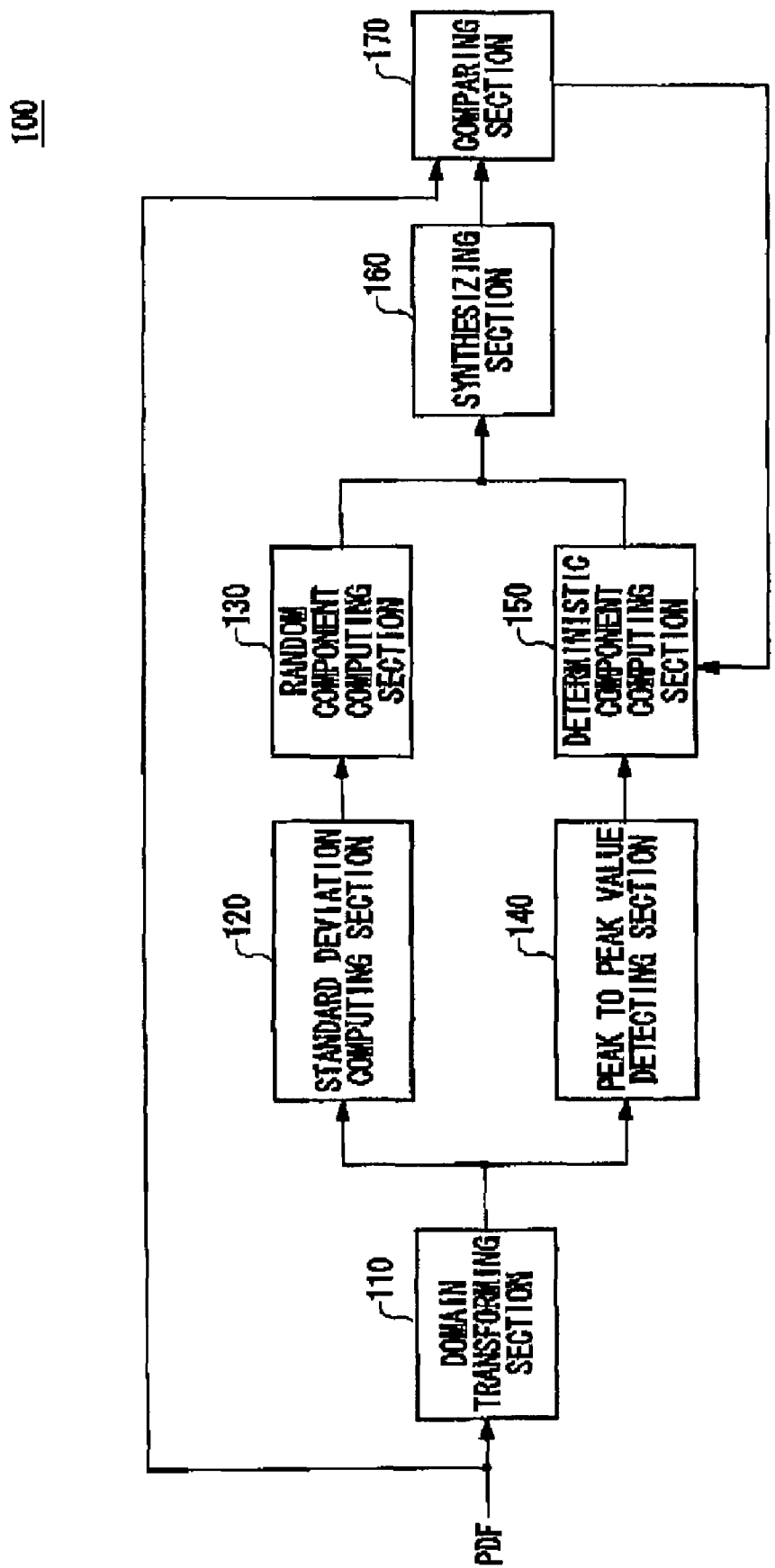
FIG. 10 is a view showing another example of a configuration of a probability density function separating apparatus 100.

FIG. 10 is a view showing another example of a configuration of the probability density function separating apparatus 100. The probability density function separating apparatus 100 according to the present example further includes a synthesizing section 160 and a comparing section 170 in addition to a configuration of the probability density function separating apparatus 100 described with reference to FIG. 1. Other components have a function equal to that of components that have been described using the same symbols in FIG. 1.

The synthesizing section 160 generates a composite probability density function (hereinafter, referred to as a composite PDF) obtained by convolving (convolution integrating) a probability density function of a random component computed by the random component computing section 130 and a probability density function of a deterministic component computed by the deterministic component computing section 150.

The comparing section 170 compares a composite PDF output from the synthesizing section 160 and an input PDF. As described in FIG. 7, the deterministic component computing section 150 is previously supplied with a function of which a peak to peak value is unknown and substitute the peak to peak value detected by the peak to peak value detecting section 140 into the function, in order to compute a probability density function with a deterministic component. At this time, this function is different according to whether a deterministic component is a sine wave, uniform distribution, triangular distribution, or dual Dirac. For this reason, in order to compute a probability density function with a deterministic component based on a peak to peak value, it is preferable to be able to decide which function is a function with a deterministic component.

The deterministic component computing section 150 may be supplied with which function is a function with a deterministic component in advance. Moreover, the deterministic component computing section 150 may be previously supplied with a plurality of functions according to the type of distribution of a deterministic component, substitute the peak to peak value detected by the peak to peak value detecting section 140 into each function, and respectively compute a probability density function for each type of distribution of a deterministic component.

In this case, the synthesizing section 160 respectively synthesizes each probability density function output from the deterministic component computing section 150 and a probability density function output from the random component computing section 130. The comparing section 170 respectively compares the composite PDF each synthesized by the synthesizing section 160 and the input PDF. The comparing section 170 selects a function appropriate as a function showing a deterministic component included in the input PDF based on a comparison result for each composite PDF. For example, the comparing section 170 may select a function in which a difference between the composite PDF and the input PDF becomes smallest.

Then, the deterministic component computing section 150 may output a probability density function with a deterministic component corresponding to the function selected by the comparing section 170 as an appropriate probability density function. By such a process, although a type of distribution of a deterministic component is indefinite, it is possible to select appropriate distribution from distribution of a predetermined type and compute a probability density function with a deterministic component included in an input PDF.

Moreover, the peak to peak value detecting section 140 detects a peak to peak value with predetermined measurement resolution. In this case, the detected peak to peak value includes an error according to measurement resolution. The probability density function separating apparatus 100 in the present example can perform a process reducing this measurement error. Moreover, the probability density function separating apparatus 100 may perform both of selection of a function prescribing the deterministic component and a process reducing a measurement error to be described below.

For example, the deterministic component computing section 150 computes a deterministic component corresponding to each peak to peak value when sequentially clanging the peak to peak values using the peak to peak value detected by the peak to peak value detecting section 140 as a reference. At this time, the deterministic component computing section 150 may sequentially change the peak to peak values in a range according to measurement resolution. For example, when measurement resolution is 2a and the peak to peak value detected from the peak to peak value detecting section 140 is $2\,T_0$, the deterministic component computing section 150 may sequentially change the peak to peak values in a range of $2\,T_0-a$ to $2\,T_0+a$. At this time, it is preferable that resolution changing a peak to peak value is sufficiently smaller than measurement resolution.

The synthesizing section 160 sequentially generates composite PDF obtained by sequentially synthesizing a probability density function with each deterministic component sequentially output from the deterministic component computing section 150 and a probability density function with a random component. The comparing section 170 compares each composite PDF and the input PDF, and selects either of the peak to peak values as an optimum value based on the comparison result. By such a process, it is possible to reduce a measurement error caused by measurement resolution.

Figure 11:
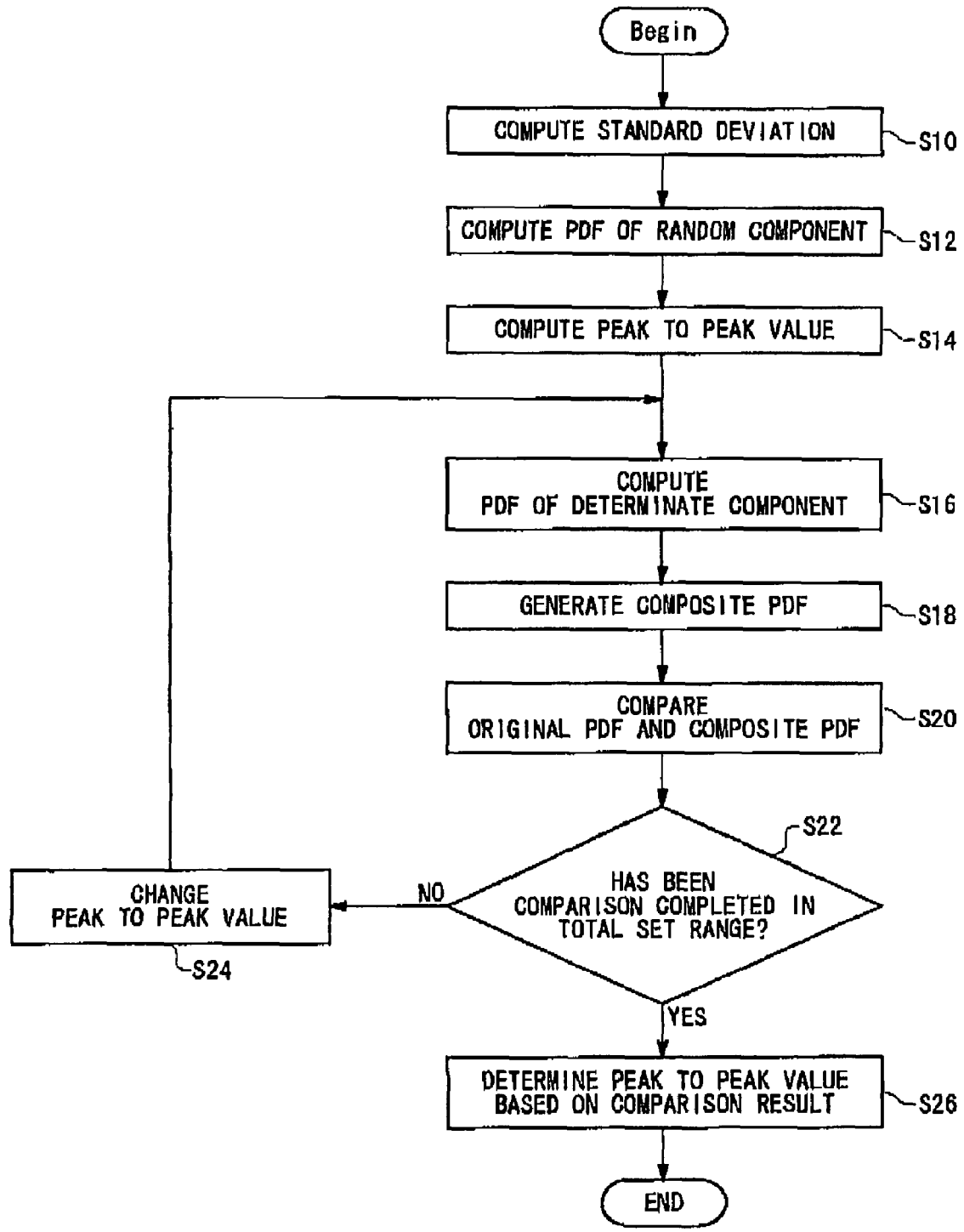
FIG. 11 is a view exemplary showing operations of a probability density function separating apparatus 100 shown in FIG. 10.

FIG. 11 is a view exemplary showing operations of the probability density function separating apparatus 100 shown in FIG. 10. In this example, it will be explained about an operation when reducing the measurement error. First, the domain transforming section 110 transforms the input PDF into a spectrum in a frequency domain. Then, the standard deviation computing section 120 computes standard deviation of a random component included in the input PDF based on this spectrum (S10). Then, the random component computing section 130 computes a probability density function with this random component based on this standard deviation (S12).

Next, the peak to peak value detecting section 140 computes a pea to peak value of a spectrum of the input PDF (S14). Then, the deterministic component computing section 150 computes a probability density function with a deterministic component based on this peak to peak value (S16).

Next, the synthesizing section 160 generates composite PDF made by convolving a probability density friction of a random component and a probability density function of a deterministic component (S18). This synthesizing may be performed by convolution integrating probability density functions in each time domain.

Next, the comparing section 170 compares the input PDF and the composite PDF (S20). The comparing section 170 may compute an error between the input PDF and the composite PDF. This error may be root mean square of an error on a time section respectively set. Tail sections on both ends of a probability density function may be designated as the time sections.

Next, the peak to peak value is changed in predetermined entire range, and it is determined whether comparison between the input PDF and the composite PDF has been completed (S22). When there is a range in which the peak to peak value is not changed, the peak to peak value is changed into a value to be compared (S24), and processes of S16 to S20 are repeated.

When the peak to peak value is changed in entire range, a peak to peak value having a small error is determined based on the comparison result in S20 for each peak to peak value (S26).

By such a process, it is possible to reduce a measurement error and determine an optimal peak to peak value. The B(f) of Expression (5) may be recalculated to compute standard deviation of a random component with high precision by means of a probability density function with a deterministic component having this peak to peak value.

Tails on both ends of a probability density function are decided by a random component. On the contrary, it is possible to compare a value of a probability density function with a predetermined threshold value from both ends to a central portion and detect a time width having probability density larger than this threshold value, in order to compute D(p-p).

Figure 12A:
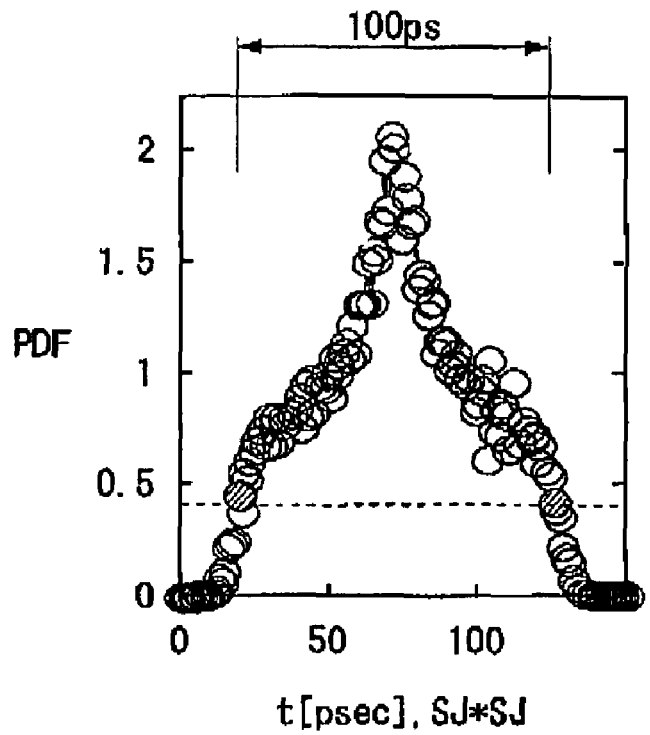
FIG. 12A show a probability density function with a deterministic component including a sine wave and a sine wave of which energy is relatively smaller than that of the sine wave as a deterministic jitter.

FIG. 12A shows a probability density function with a deterministic component including a sine wave and a sine wave of which energy is relatively smaller than that of the sine wave as a deterministic jitter. In this case, this probability density function is obtained, by convolution integrating two sine waves. An expected value of D(p-p) of a relatively large sine wave in the present example is set as 50 ps.

Figure 12B:
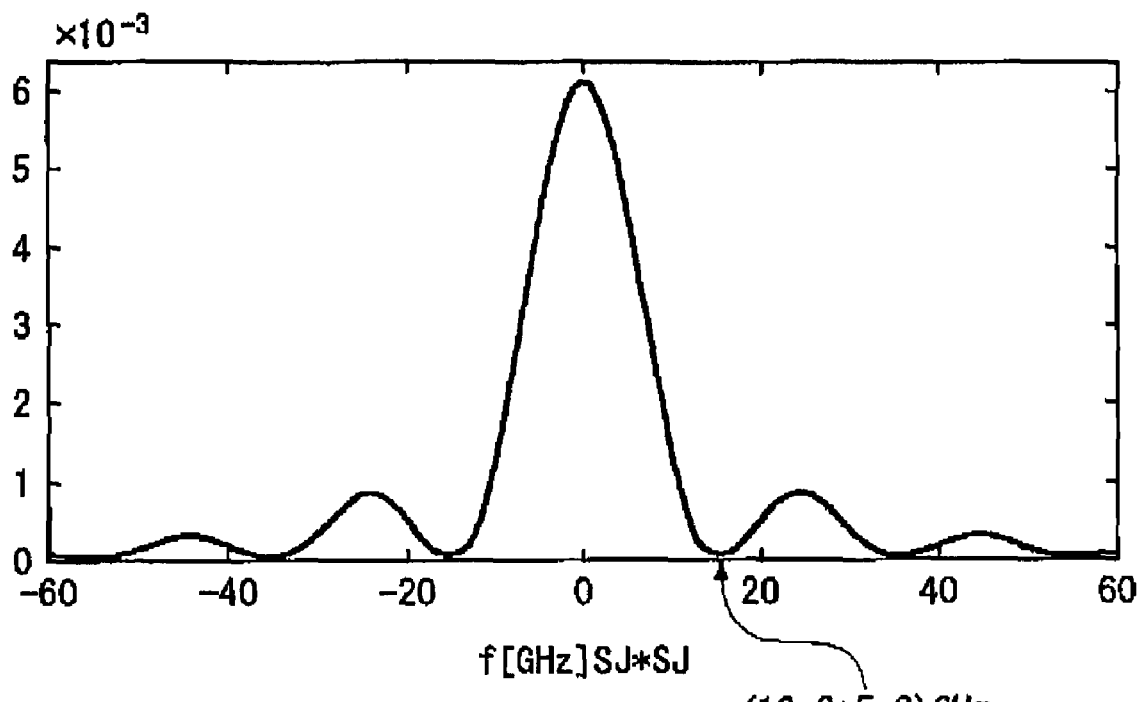
FIG. 12B shows a spectrum obtained by transforming a probability density function shown in FIG. 12A into a frequency domain.

FIG. 12B shows a spectrum obtained by transforming a probability density function shown in FIG. 12A into a frequency domain. The null frequency of this spectrum has an error of about 5 GHz with respect to the expected value of 20 GHz.

Figure 13A:
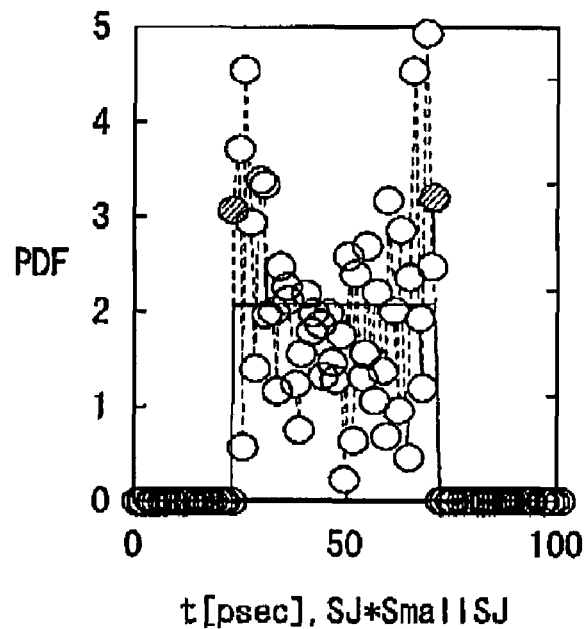
FIG. 13A is a view showing a result of comparing, to a predetermined threshold value, respective probability densities in the probability density function shown in FIG. 11A.

FIG. 13A is a view showing a result of comparing, to a predetermined threshold value, respective probability densities in the probability density function shown in FIG. 12A. As shown in FIG. 13A, respective probability densities are compared to the threshold value from both ends of the probability density function, and the time t at which the probability density becomes the threshold value or above from below the threshold value is detected. As a result, the probability density function shown by the dotted line of FIG. 13A is transformed to a uniform distribution of the solid line in FIG. 13A.

Figure 13B:
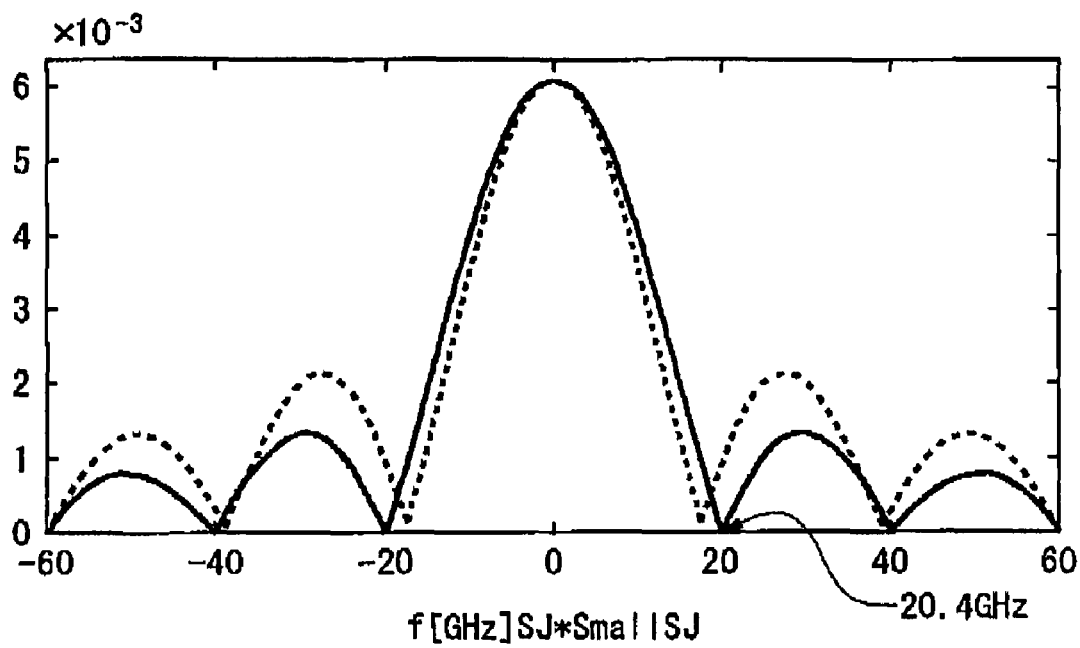
FIG. 13B is a view showing a spectrum obtained by transforming the uniform distribution shown in FIG. 13A into a frequency domain.

FIG. 13B is a view showing a spectrum obtained by transforming the uniform distribution shown in FIG. 13A into a frequency domain. The null frequency of the spectrum is 20.4 GHz substantially equal to the expected value. In this way, by detecting D(p-p) based on a predetermined threshold value, it becomes possible to acquire a practical null frequency. In this case, it is possible to obtain D(p-p) directly from the probability density function of a uniform distribution in the time domain. Accordingly, the probability density function is transformed to a uniform distribution, and so it is unnecessary to obtain the null frequency of the spectrum.

A threshold value providing D(p-p) substantially identical with an expected value can be determined by, for example, sequentially changing a threshold value to compute D(p-p) for each threshold value and detecting a threshold value of which D(p-p) is not substantially changed.

Figure 14A:
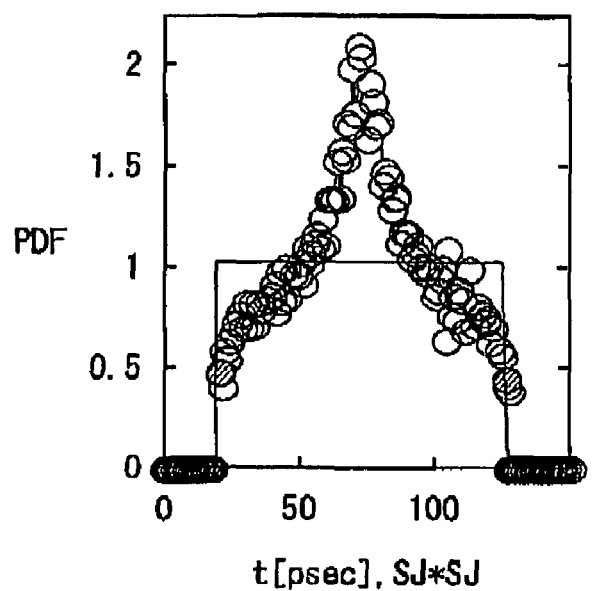
FIG. 14A shows a probability density function with a deterministic component consisting of two sine waves whose energies are equal to each other.

FIG. 14A shows a probability density function with a deterministic component including a sine wave and a sine wave of which energy is equal to that of the sine wave as a deterministic jitter. An expected value of D(p-p) in the present example is loops.

Figure 14B:
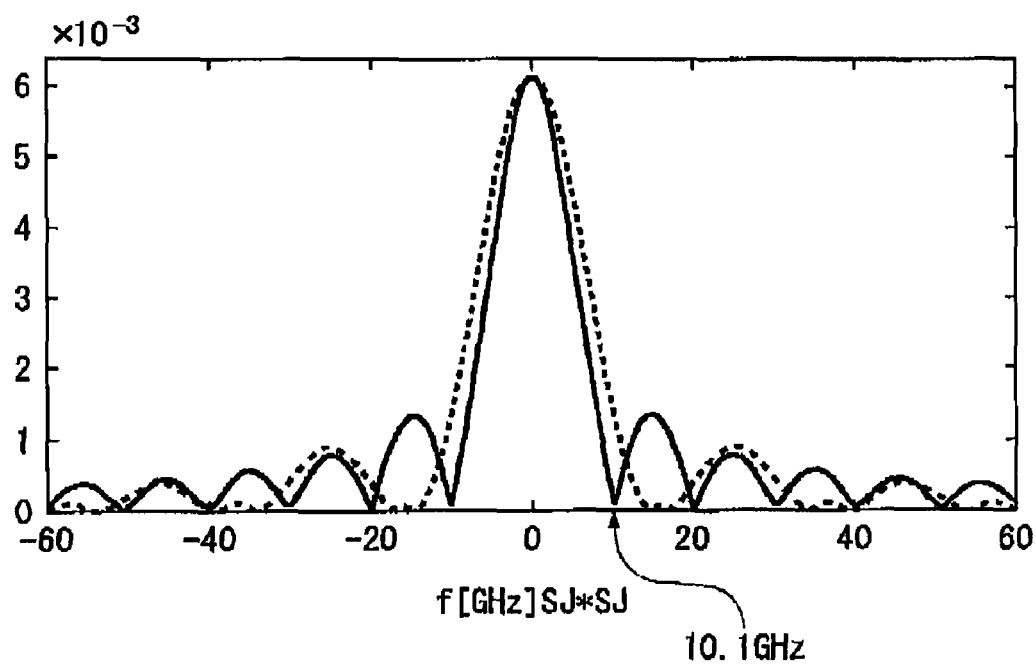
FIG. 14B shows a spectrum obtained by transforming a probability density function shown in FIG. 14A into a frequency domain.

FIG. 14B shows a spectrum obtained by transforming a probability density function shown in FIG. 14A into a frequency domain. Null frequency of this spectrum has an error of about 50 GHz for 10 GHz of an expected value.

Figure 15A:
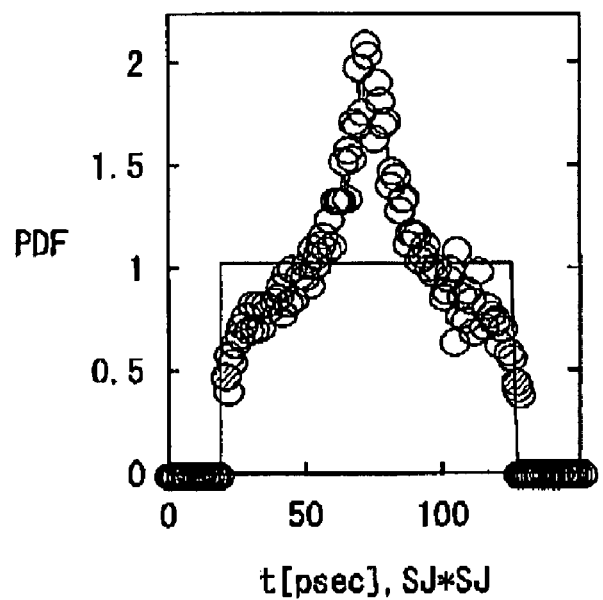
FIG. 15A is a view showing uniform distribution obtained by performing a threshold process similar to that in FIG. 13A on a probability density function shown in FIG. 14A.
Figure 15B:
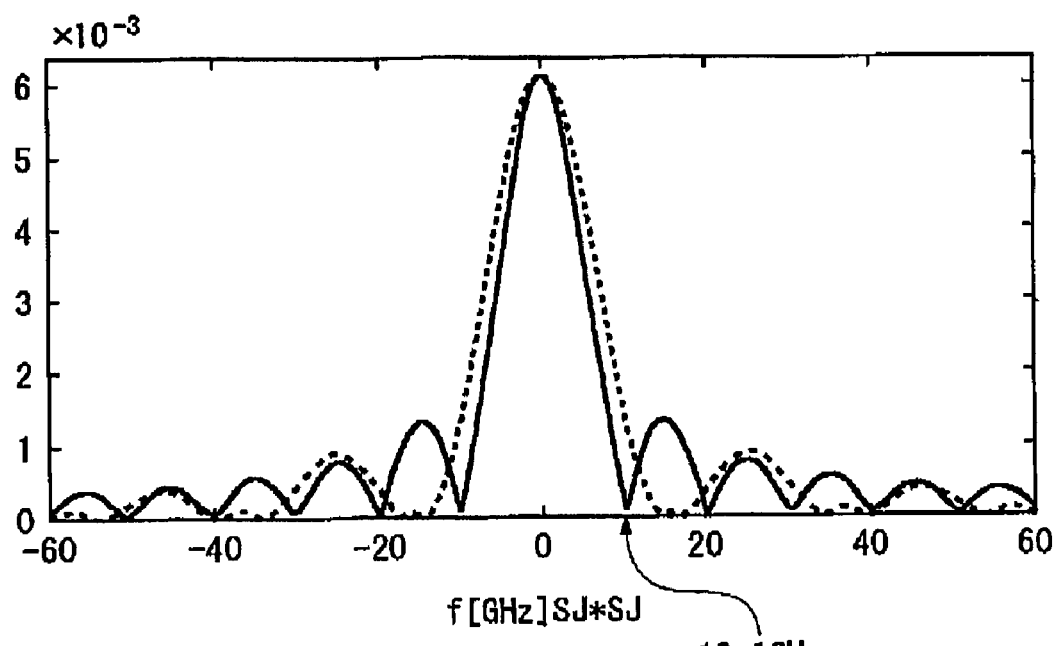
FIG. 15B is a view showing a spectrum obtained by transforming uniform distribution shown in FIG. 15A into a frequency domain.

FIG. 15A is a view showing uniform distribution obtained by performing a threshold process similar to that in FIG. 13A on a probability density function shown in FIG. 14A. FIG. 15B is a view showing a spectrum obtained by transforming uniform distribution shown in FIG. 15A into a frequency domain. Also in this example, it is possible to obtain 10.1 GHz substantially equal to an expected value as D(p-p) by performing a threshold process.

FIG. 16 shows values of D(p-p) measured by a threshold process and D(δδ) measured by a conventional method for a probability density function including a plurality of deterministic jitters. As described with reference to FIG. 12 and FIG. 13, when measuring a probability density function made by convolution integrating two sine waves of a sine wave and a relatively small sine wave as a deterministic jitter, in the measurement performing a threshold process, it is possible to obtain D(p-p)=49.0 ps substantially equal to an expected value.

As described in FIGS. 14 and 15, in case of measuring a probability density function made by convolution integrating two sine waves, in a conventional curve fitting method, a result of D(δδ)=80.5 ps is obtained when an expected value of a peak to peak value of a deterministic component is 100 ps. As opposed to this, in the measurement performing a threshold process, it is possible to obtain D(p-p)=99.0 ps substantially equal to an expected value. Moreover, conventionally, each deterministic component cannot be separated from a probability density function in which a plurality of deterministic components is convolution integrated.

Figure 17B:
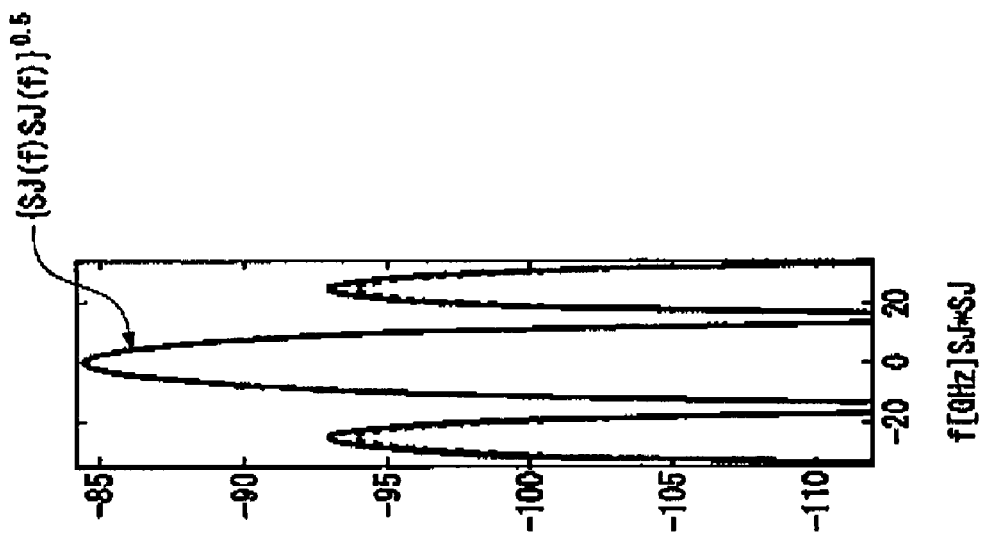
FIG. 17B is a view showing comparison for a main lobe.
Figure 17A:
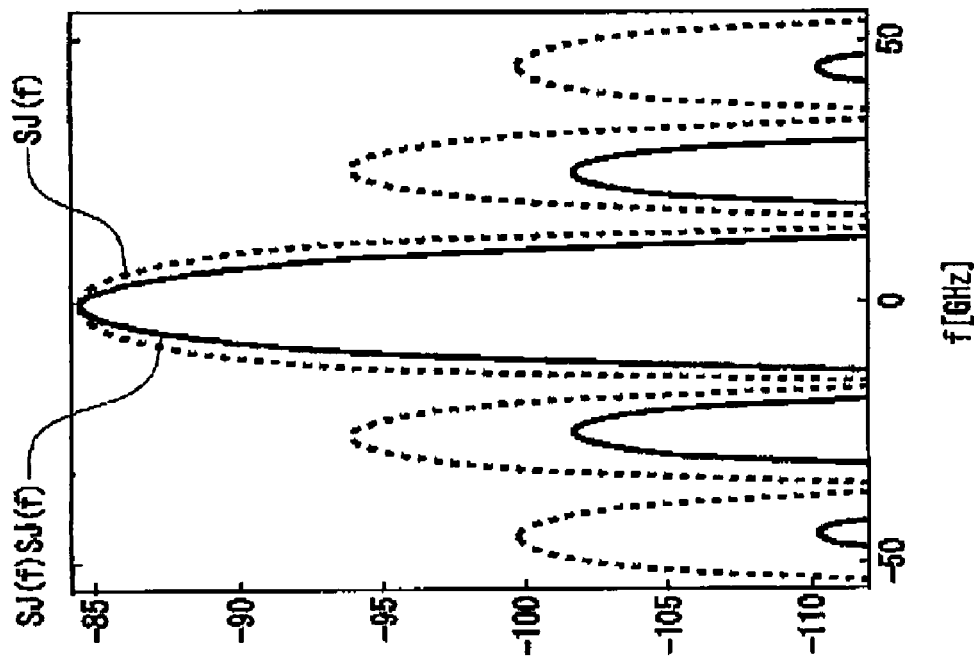
FIG. 17A shows a spectrum of a probability density function with a deterministic component of a sine wave and a spectrum of a probability density function with a deterministic component in which two sine waves are convolution integrated.

FIG. 17A shows a spectrum of a probability density function with a deterministic component of a sine wave and a spectrum of a probability density function with a deterministic component in which two sine waves are convolution integrated. Since a spectrum of a probability density function in which two sine waves are convolution integrated is a square of a spectrum of a probability density function of one sine wave, a level of a main lobe adjacent to 0 Hz changes. In other words, as shown in FIG. 17B, when raising a spectrum of a probability density function in which two sine waves are convolution integrated to 0.5th power, a probability density function of one sine wave and a main lobe are to be identical with each other. Using the above-described principle, it is possible to obtain the number of deterministic components included in a probability density function.

Figure 18:
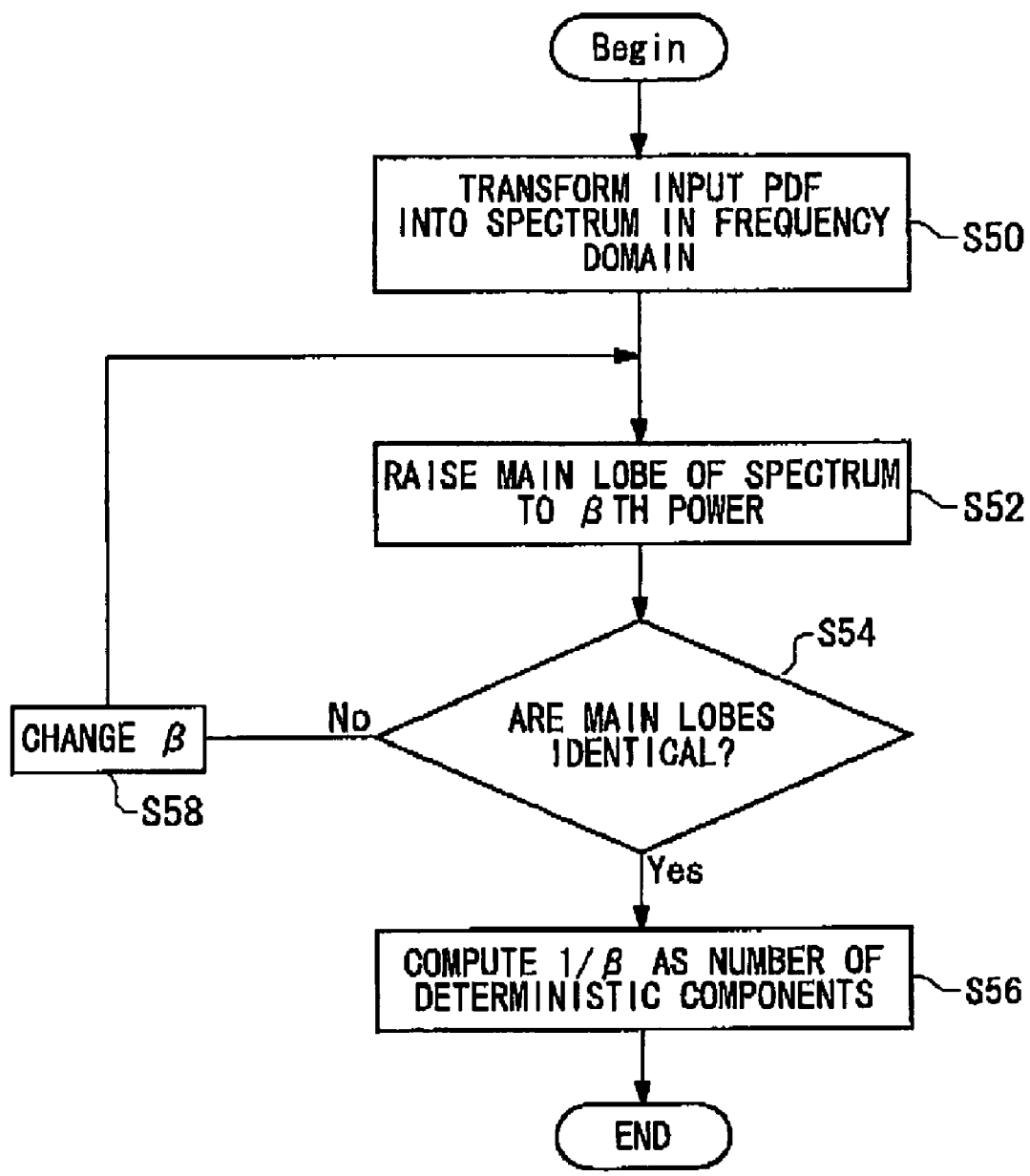
FIG. 18 is a flowchart exemplary showing a method for obtaining the number of deterministic components included in a probability density function.

FIG. 18 is a flowchart exemplary showing a method for obtaining the number of deterministic components included in a probability density function. First, an input PDF is transformed into a spectrum in a frequency domain (S50). The step S50 may be performed by the domain transforming section 110.

Next, a main lobe of a spectrum is raised to βth power (S52). Then, it is decided whether a main lobe of a spectrum of a probability density function with a predetermined deterministic component and β power of the main lobe obtained in S52 are identical with each other (S54). That main lobes are identical with each other may be determined when an error between the main lobes is within a predetermined range. A probability density function with a predetermined deterministic component may be designated by a user. Moreover, as described in reference to FIG. 10, the deterministic component computing section 150 may select a probability density function with a deterministic component out of a previously given plurality of functions.

In S54, when it is determined that the main lobes are not identical with each other, β is changed (S58), and then the processes of S52 and S54 are repeated. Moreover, in S54, when it is determined that the main lobes are identical with each other, the number of deterministic components is computed in S56.

In S56, 1/β is computed as the number of deterministic components. At this time, β is not limited to an integer number. A value of β after the decimal point shows that a deterministic component with the different size is included.

For example, when D(p-p) values of two sine waves described in FIGS. 14 and 15 are 50 ps, the whole value of D(p-p) becomes 100 ps. Then, for example, when performing a threshold process described in FIG. 15, a value substantially equal to 100 ps is measured as D(p-p) of a deterministic jitter.

Furthermore, by a method described in reference to FIG. 18, the number of deterministic components is computed. Since values of D(p-p) of two sine waves are substantially equal, β=0.5 is computed and the number of deterministic components becomes two. From the above-described result, it is possible to compute D(p-p) of each sine wave as 50 ps.

As described above, according to this method, it is possible to estimate the number of deterministic components from a probability density function including a plurality of deterministic components. The number of deterministic components may be computed by the deterministic component computing section 150 according to the method.

Figure 19:
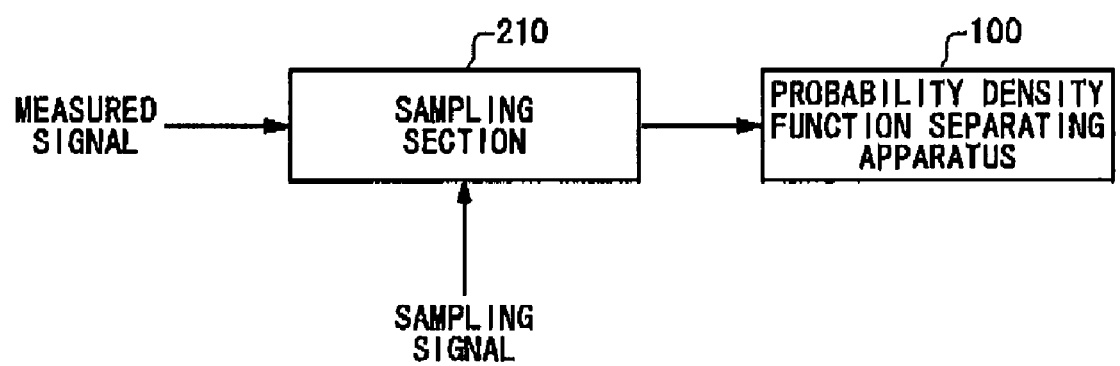
FIG. 19 is a view exemplary showing a configuration of a noise separating apparatus 200 according to an embodiment of the present invention.

FIG. 19 is a view exemplary showing a configuration of a noise separating apparatus 200 according to an embodiment of the present invention. The noise separating apparatus 200 separates a probability density function with a predetermined noise component from a probability density function of a signal under measurement. For example, the noise separating apparatus 200 separates a random noise component and a deterministic noise component from a probability density function with noises included in the signal under measurement.

The noise separating apparatus 200 includes a sampling section 210 and the probability density function separating apparatus 100. The probability density function separating apparatus 100 may have the same function and configuration as those of the probability density function separating apparatus 100 described in FIGS. 1 to 18.

The sampling section 210 samples the signal under measurement according to a given sampling signal, and generates a probability density function of the signal under measurement. For example, the sampling section 210 may generate a probability density function with jitter included in the signal under measurement, or generate a probability density function with amplitude noises of the signal under measurement.

Figure 20:
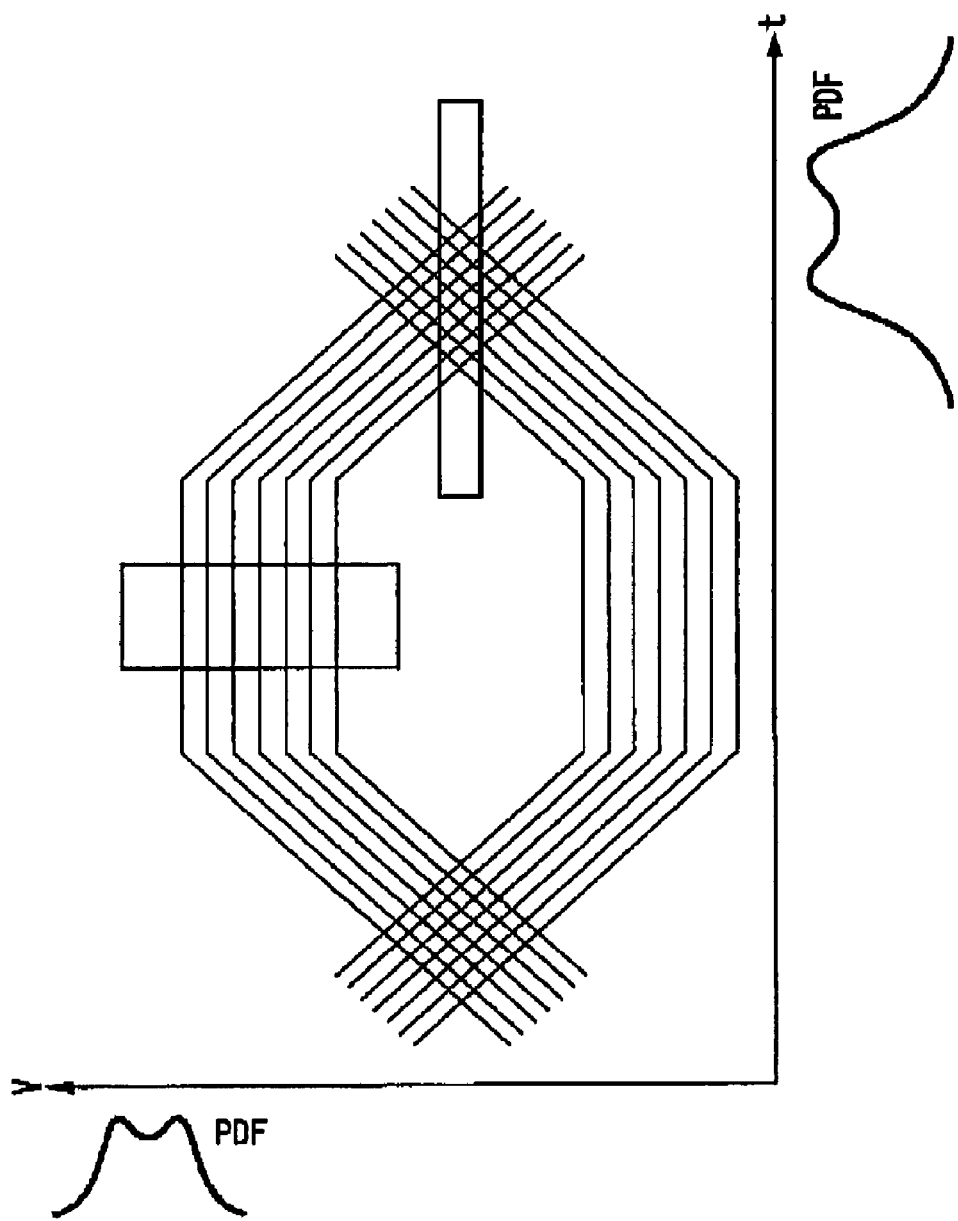
FIG. 20 is a view exemplary showing a probability density function of a signal under measurement generated from a sampling section 210.

FIG. 20 is a view exemplary showing a probability density function of a signal under measurement generated from the sampling section 210. The sampling section 210 according to the present example outputs a probability density function of a signal under measurement as described in FIG. 19. FIG. 11 shows an eye diagram of the signal under measurement assuming that a horizontal axis is a time and a vertical axis is a level of the signal under measurement. The sampling section 210 may acquire this eye diagram.

When generating a probability density function with jitter included in the signal under measurement, the sampling section 210 computes a probability by which an edge of the signal under measurement exists for each time. For example, the sampling section 210 may sample the signal under measurement by multiple times for each of relative timings for the signal under measurement in a transition timing of the signal under measurement. Then, a probability by which an edge exists at each of the relative timings may be acquired based on a sampling result.

Moreover, when generating a probability density function of amplitude noises in a signal under measurement, the sampling section 210 acquires a probability by which the signal under measurement is likely to have a particular amplitude value. For example, the sampling section 210 acquires an amplitude value of the signal under measurement at the generally same relative timing to the signal under measurement in a stationary timing of the signal under measurement.

When the sampling section 210 is a comparator for comparing a reference voltage and a level of the signal under measurement, the sampling section 210 may change this reference voltage and sample the signal under measurement for each reference voltage by multiple times. For each amplitude value the sampling section 210 acquires a probability based on a sampling result.

The probability density function separating apparatus 100 separates a random component and a deterministic component from a probability density function provided from the sampling section 210. For example, when this probability density function is a probability density function of jitter in a signal under measurement, the probability density function separating apparatus 100 can separate a random jitter from a deterministic jitter in the signal under measurement with high precision.

Moreover, when this probability density function is a probability density function of amplitude noises in a signal under measurement, the probability density function separating apparatus 100 can separate a random component from a deterministic component in amplitude noises of the signal under measurement with high precision. For this reason, according to the noise separating apparatus 200 in the present example, it is possible to separate a noises component of a signal under measurement with high precision and thus analyze the signal under measurement with high precision.

Moreover, the noise separating apparatus 200 can also separate a random component from a deterministic component in noises of a sampling signal given to the sampling section 210. For example, the sampling section 210 has a comparator or an ADC for converting a level of a signal under measurement into a digital value according to the sampling signal. Wizen an analog sinusoidal jitter or amplitude noise is given as a signal under measurement, a probability density function of digital data output from the comparator or the ADC in the sampling section 210 shows a characteristic that both ends sharply attenuated as shown in FIG. 2. However, when internal noises occur in a sampling signal and measurement errors occur in digital data, this probability density function becomes a composite component of a random component and a deterministic component.

The sampling section 210 generates a probability density function of the signal under measurement based on a result obtained by sampling the signal under measurement with small noises. Then, the probability density function separating apparatus 100 separates a random component and a deterministic component included in this probability density function. In this way, it is possible to measure noises of a sampling signal with high precision. Moreover, the noise separating apparatus 200 can be also used for a test of the ADC. That is to say, it is possible to separate a deterministic component caused by a code error of the ADC.

Figure 21:
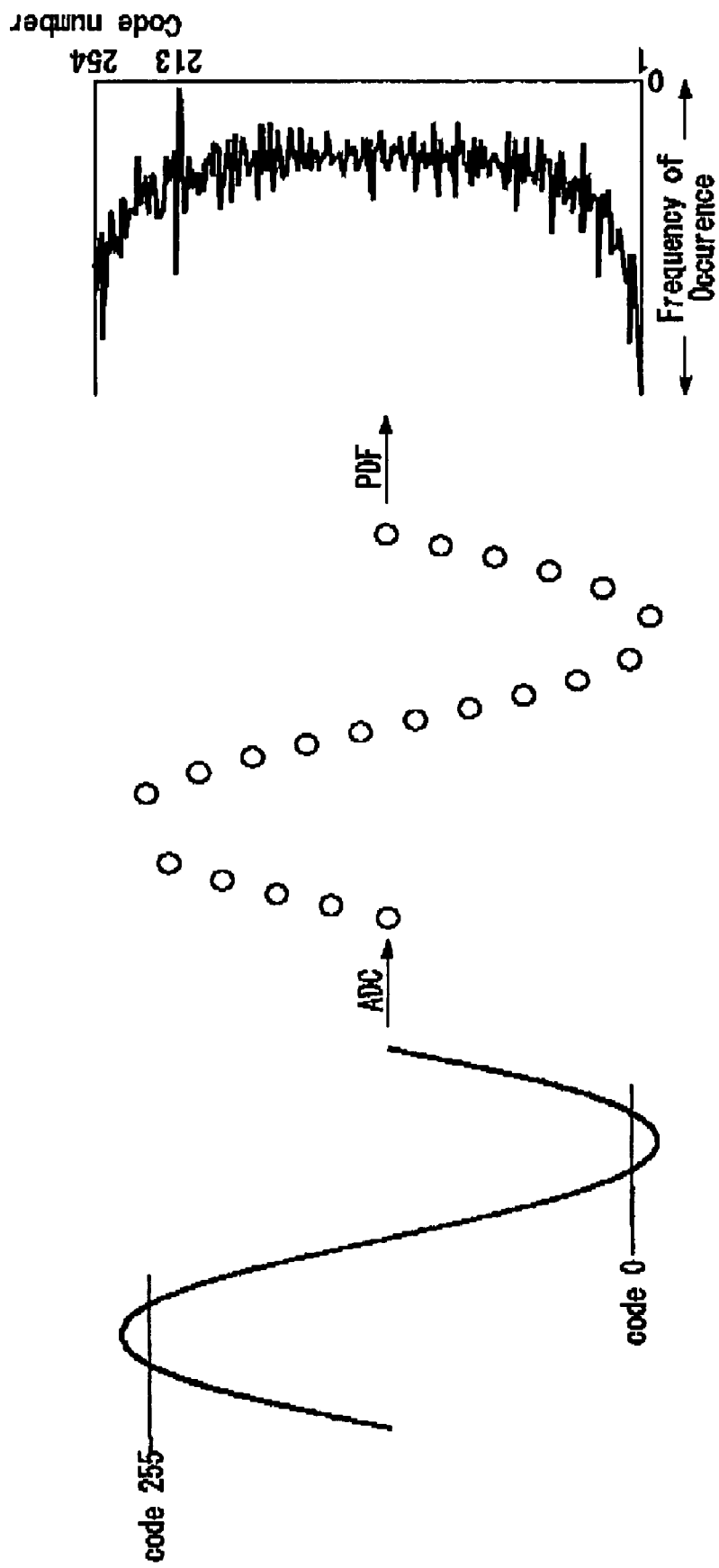
FIG. 21 is a view explaining a deterministic component by a code error of ADC.

FIG. 21 is a view showing probability density of each code of an ADC when the ADC samples a sine wave without noises. Here, a code of the ADC is a code corresponding to each digital value output from the ADC. The ADC determines which code corresponds to a level of a signal to be input, and outputs a digital value according to this code.

Figure 27:
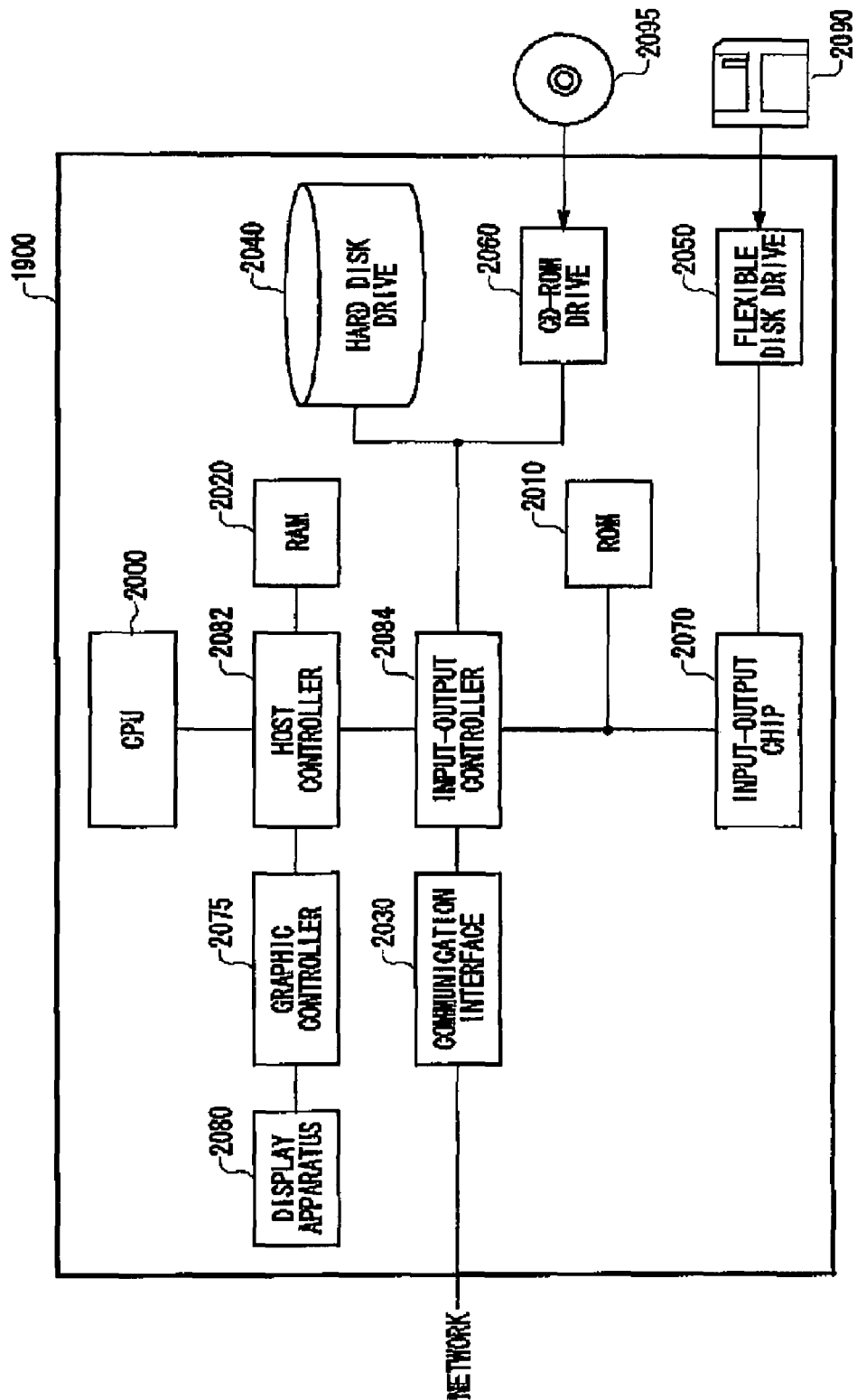
FIG. 27 is a view exemplary showing a hardware configuration of a computer 1900 according to the present embodiment.

In the present example, the ADC has codes of 0 to 255. Here, it will be described, for example, about when an error occurs in the 213th code and a level corresponding to this code cannot be detected. In this case, as shown in FIG. 27, probability density of the code 213 deteriorates and probability density of a code (a code 214 in the present example) adjacent to the code 213 rises. The reason is that the code 214 detects a level of a sine wave to be originally detected by the code 213.

A probability density function shown in FIG. 21 includes a deterministic component by a sine wave to be input and a deterministic component camp by a code error of the ADC. As described in reference to FIG. 18, the probability density function separating apparatus 100 can separate these deterministic components.

Figure 22:
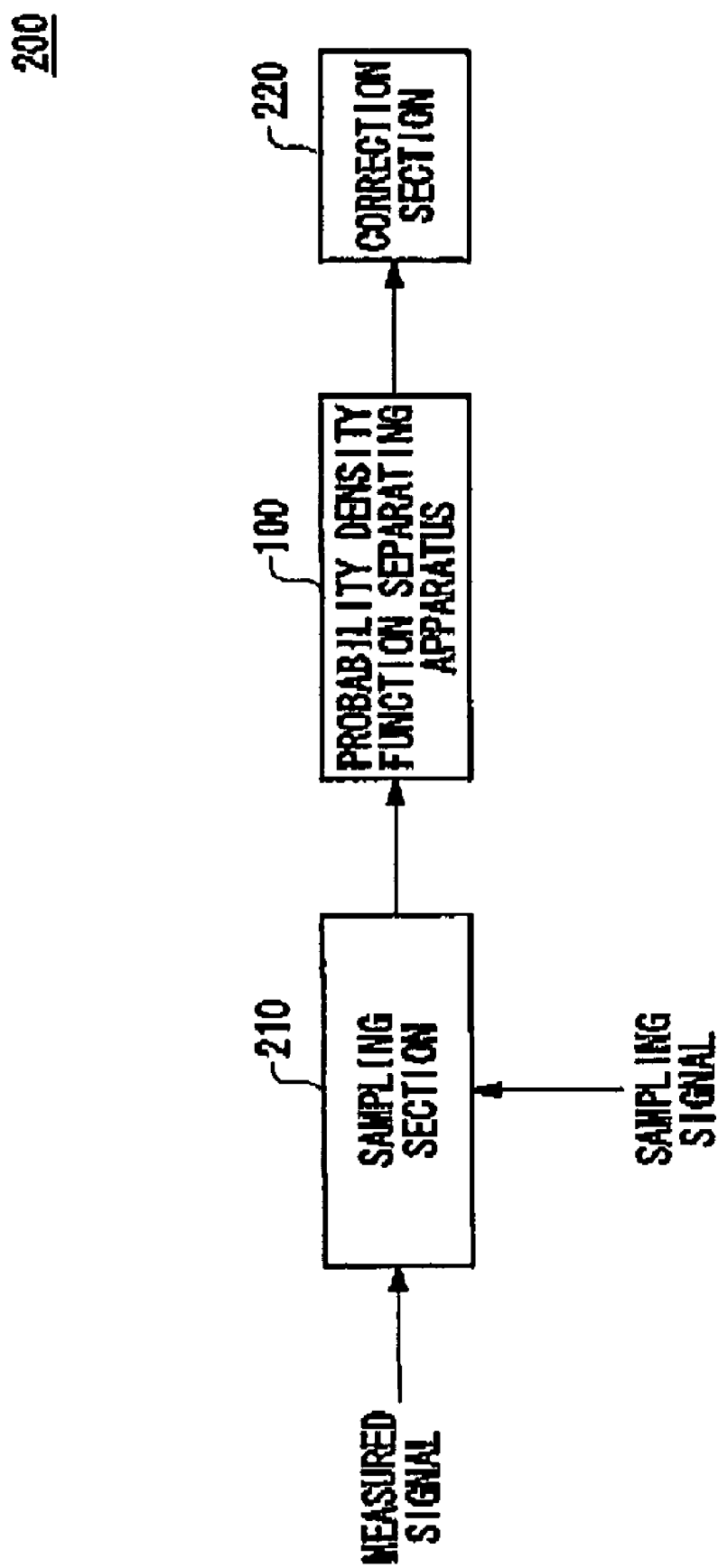
FIG. 22 is a view showing another example of a configuration of a noise separating apparatus 200.

FIG. 22 is a view showing another example of a configuration of the noise separating apparatus 200. The noise separating apparatus 200 in the present example further includes a correction section 220 in addition to a configuration of the noise separating apparatus 200 described with reference to FIG. 19. The noise separating apparatus 200 in the present example reduces an influence by internal noises of the above-described sampling signal to separate a deterministic component and a random component from a probability density function of a signal under measurement.

For example, when reducing an influence by noises of a sampling signal, the sampling section 210 first functions as a sampling signal measuring section that computes a probability density function of a sampling signal itself as described above. At this time, it is preferable that the sampling section 210 is supplied with a reference signal with small noises. Moreover, the sampling section 210 functions as a signal under measurement measuring section that computes a probability density function of a measurement signal to be measured. At this time, the sampling section 210 may perform an operation similar to that of the sampling section 210 described in FIG. 20.

The probability density function separating apparatus 100 separates a random component and a deterministic component from each of a probability density function of a signal under measurement and a probability density function of a timing signal. Then, the correction section 220 separates a random component from a deterministic component in the signal under measurement with higher precision by correcting a parameter of the probability density function of the signal under measurement based on the probability density function of the timing signal.

For example, the correction section 220 may correct a random component according to the signal tinder measurement by subtracting energy of a random component according to the timing signal from energy of a random component according to the signal under measurement. Moreover, the correction section 220 may correct a deterministic component according to the signal under measurement by subtracting a deterministic component according to the timing signal from a deterministic component according to the signal under measurement. By such a process, it is possible to separate a random component from a deterministic component according to a signal under measurement with high precision.

Figure 23:
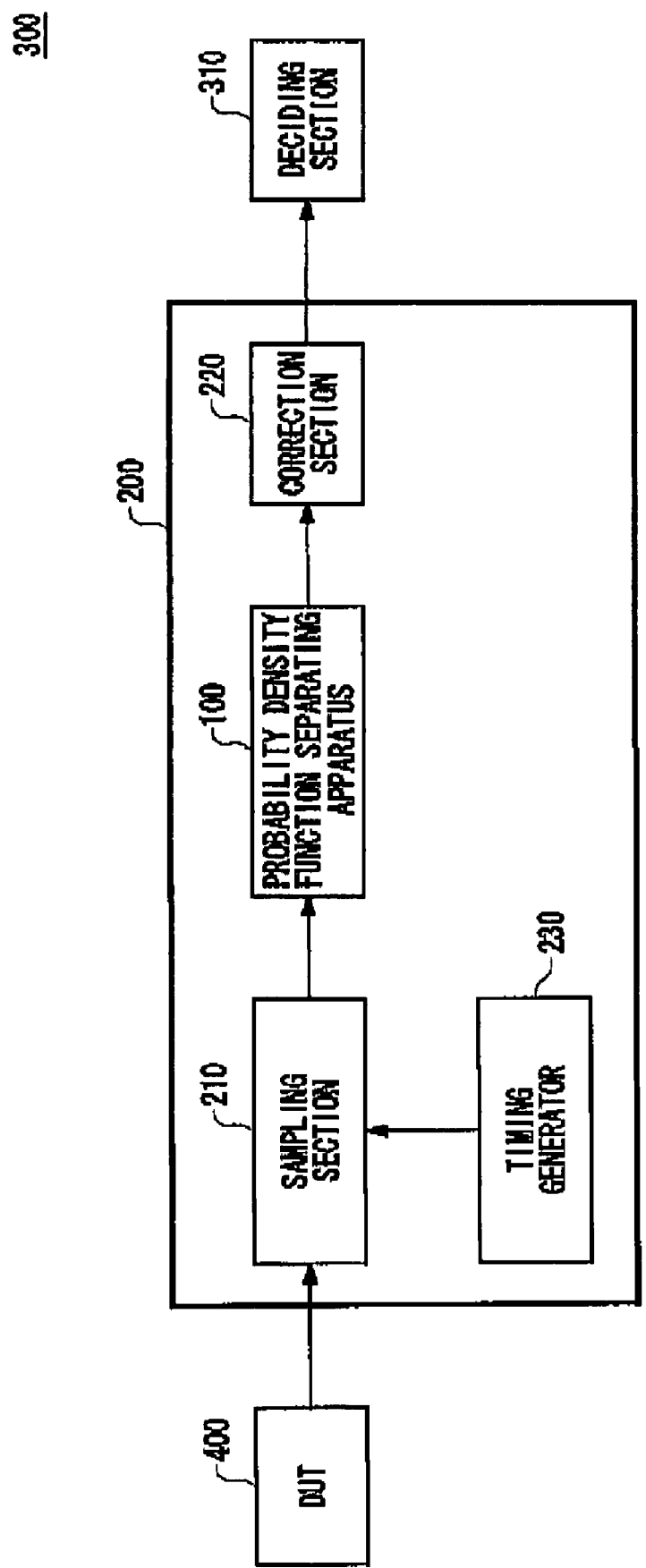
FIG. 23 is a view exemplary showing a configuration of a testing apparatus 300 according to an embodiment of the present invention.

FIG. 23 is a view exemplary showing a configuration of a testing apparatus 300 according to an embodiment of the present invention. The testing apparatus 300 is an apparatus for testing a device under test 400 and includes a noise separating apparatus 200 and a deciding section 310.

The noise separating apparatus 200 has a configuration substantially equal to that of the noise separating apparatus 200 described in FIGS. 19 to 22 and measures a signal under measurement output from the device under test 400. In the present example, the noise separating apparatus 200 has a configuration substantially equal to that of the noise separating apparatus 200 shown in FIG. 22. The noise separating apparatus 200 may have a timing generator 230 for generating a timing signal as shown in FIG. 22. The other components are equal to components with the same symbol described in reference to FIGS. 19 to 22.

The deciding section 310 decides the good or bad of the device under test 400 based on a random noise component and a deterministic noise component separated from the noise separating apparatus 200. For example, the deciding section 310 may decide the good or bad of the device under test 400 based on whether standard deviation of the random noise component is within a predetermined range. Moreover, the deciding section 310 may decide the good or bad of the device under test 400 based on whether a peak to peak value of the deterministic noise component is within a predetermined range. According to the testing apparatus 300 in the present example, since a probability density function of a signal under measurement can be separated with high precision, it is possible to decide the good or bad of the device under test 400 with high precision.

FIG. 24 is a view exemplary showing a measurement result of jitter by the noise separating apparatus 200 and a measurement result of jitter by a conventional method. As shown in FIG. 24, the noise separating apparatus 200 can obtain a measurement result with precision more preferable than a conventional method in any measurement result of a random jitter and a deterministic jitter, about when only a random jitter is included in a signal under measurement, when a random jitter and sine wave jitter (a deterministic jitter) are included in a signal under measurement, and when noises are included in a sampling signal.

Figure 25:
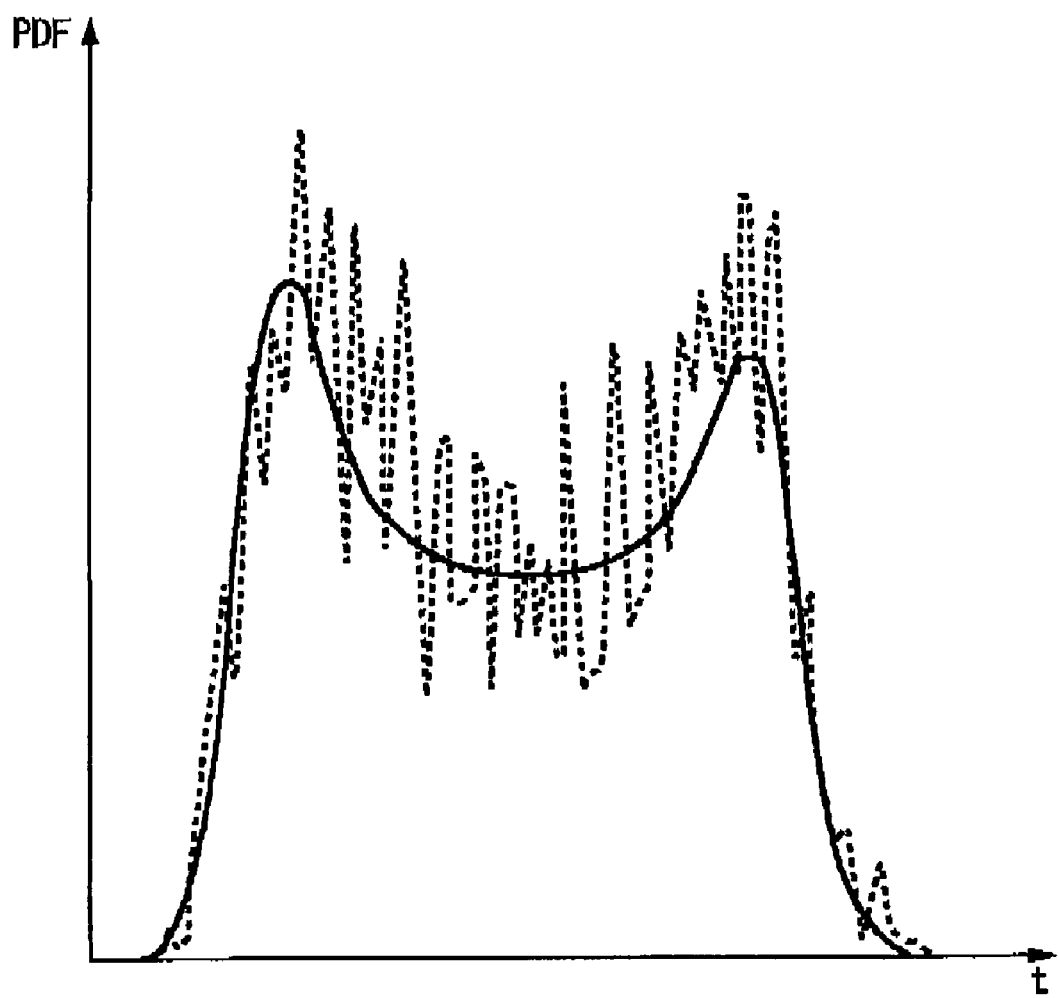
FIG. 25 is a view showing a conventional measurement result described in FIG. 24.

FIG. 25 is a view showing a conventional measurement result described in FIG. 24. As described above, according to a conventional measuring method, tail portions of an input PDF shown with a wavy line in FIG. 25 is curve fitted. As a result, random components as shown with a solid line in FIG. 25 is detected. Moreover, an interval between two peaks of this random components is detected as a deterministic component. When using such a measuring method, since curve-fitting approximation is used, each component cannot be measured with high precision. For this reason, a measurement result has gross errors with respect to an expected value as shown in FIG. 24.

Moreover, this method cannot separate a deterministic component caused by the above-described error in sampling signal and a deterministic component caused by a code error of an ADC. For this reason, for example, when a sampling error occurs as shown in FIG. 24, it is not possible to perform measurement with high precision.

Figure 26B:
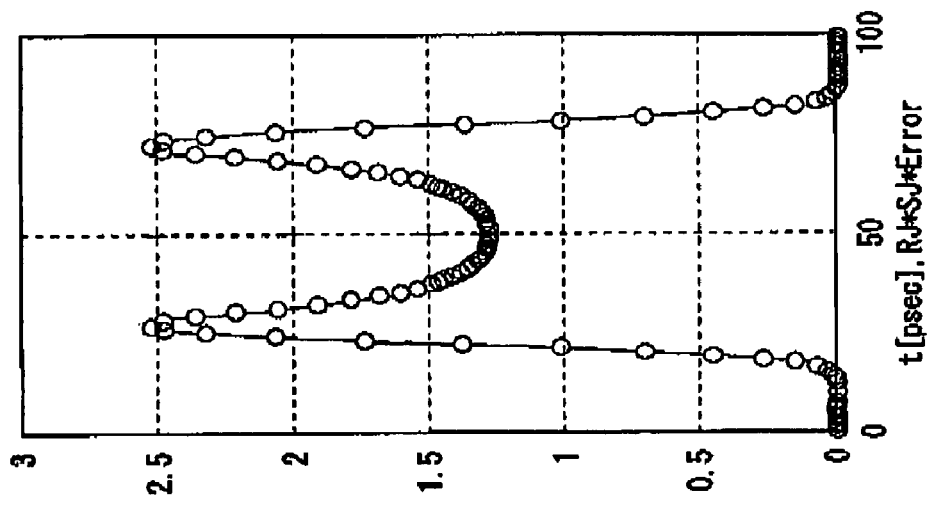
FIGS. 26A and 26B are views showing a measurement result by the present invention described in FIG. 24.
Figure 26A:
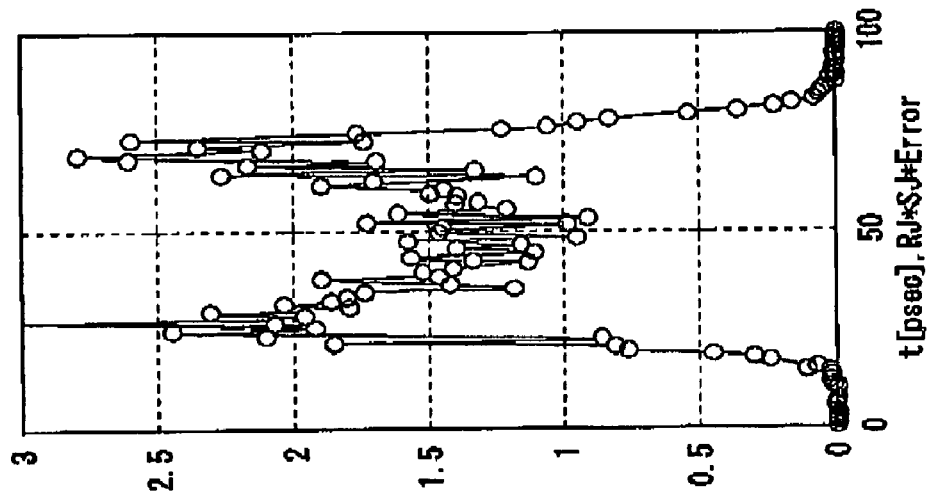

FIGS. 26A and 26B are views showing a measurement result by the present invention described in FIG. 24. FIG. 26A shows an input PDF and FIG. 26B shows a probability density function obtained by convolving a deterministic component and a random component separated using the probability density function separating apparatus 100. The probability density function separating apparatus 100 can separate a random component from a deterministic component in the input PDF with high precision as described above. For this reason, as shown in FIG. 24, it is possible to obtain a measurement result with a small error for an expected value. Furthermore, since the present invention can separate a plurality of deterministic components, it is possible to separate, for example, a deterministic component of a sinusoid and a deterministic component caused by timing errors in a sampling signal. As a result, it is possible to perform measurement with higher precision.

FIG. 27 is a view exemplary showing a hardware configuration of a computer 1900 according to the present embodiment. The computer 1900 functions as the probability density function separating apparatus 100, the jitter separating apparatus 200, the computing apparatus, the testing apparatus 300, or the bit error rate measuring apparatus 500 described in FIGS. 1 to 26, based on a given program. For example, when the computer 1900 functions as the probability density function separating apparatus 100, the program may make the computer 1900 function as each component of the probability density function separating apparatus 100 described with reference to FIGS. 1 to 18. Moreover, when the computer 1900 functions as the noise separating apparatus 200, the program may make the computer 1900 function as each component of the noise separating apparatus 200 described with reference to FIGS. 19 to 26.

Moreover, when the computer 1900 functions as the computing apparatus, the program may make the computer 1900 function as a computing apparatus including the time domain computing section 138 described in FIGS. 8 and 9. For example, when the computer 1900 functions as the computing apparatus that directly computes a probability density function in a time domain of a random component from a Gaussian curve in a frequency domain, the program may make the computer 1900 function as each component of the random component computing section 130 described in FIG. 9. Moreover, when the computer 1900 functions as the computing apparatus that computes a waveform in a time domain from a spectrum in an arbitrary frequency domain, the program may make the computer 1900 function as the time domain computing section 138 and the frequency domain measuring section described with reference to FIG. 9.

The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010 and the flexible disk drive 2050 and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses via the flexible disk drive 2050 and a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed in the CPU 2000.

This program is installed in the computer 1900. This program works on the CPU 2000 or the like, and makes the computer 1900 function as the probability density function separating apparatus 100, the noise separating apparatus 200, or the computing apparatus, which are previously described.

A program described above may be stored on an outside recording medium. A recording medium can include an optical recording medium such as DVD and CD, a magneto-optical recording medium such as MO, a tape medium, a semiconductor memory such as an IC card in addition to the flexible disk 2090 and the CD-ROM 2095. Moreover, a storage device such as a hard disk or a RAM provided in a server system connected to a private communication network and Internet may be used as a recording medium, and a program may be provided to the computer 1900 via a network.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to separate a random component and a deterministic component from a given probability density function with high precision.

What is claimed is:

1. A probability density function separating apparatus that separates a predetermined component in a given probability density function, comprising:
a domain transforming section that is supplied with the probability density function and transforms the probability density function into a spectrum in a frequency domain; and
a standard deviation computing section that computes standard deviation of a random component included in the probability density function based on the spectrum.

2. The probability density function separating apparatus as claimed in claim 1, wherein the standard deviation computing section computes the standard deviation based on a level of a predetermined frequency component of the spectrum.

3. The probability density function separating apparatus as claimed in claim 2, wherein the standard deviation computing section computes the standard deviation based on a difference between a level of a first frequency component and a level of a second frequency component of the spectrum.

4. The probability density function separating apparatus as claimed in claim 3, further comprising a random component computing section that computes a probability density function with a random component based on the standard deviation.

5. The probability density function separating apparatus as claimed in claim 2, wherein the standard deviation computing section computes the standard deviation based on a difference between a level of a predetermined frequency component of the spectrum and a level of a predetermined frequency component of a spectrum obtained by transforming a deterministic component included in the given probability density function into a frequency domain.

6. The probability density function separating apparatus as claimed in claim 5, further comprising a random component computing section that computes a probability density function with a random component based on the standard deviation.

7. The probability density function separating apparatus as claimed in claim 2, further comprising a random component computing section that computes a probability density function with a random component based on the standard deviation.

8. The probability density function separating apparatus as claimed in claim 1, further comprising a random component computing section that computes a probability density function with a random component based on the standard deviation.

9. The probability density function separating apparatus as claimed in claim 8, wherein the standard deviation computing section computes the standard deviation in a time domain based on the spectrum in the frequency domain.

10. The probability density function separating apparatus as claimed in claim 9, wherein the random component computing section computes the probability density function in a time domain with the random component, based on the standard deviation.

11. The probability density function separating apparatus as claimed in claim 9, wherein the standard deviation computing section detects the standard deviation in the frequency domain based on the spectrum in a frequency domain, and computes the standard deviation in a time domain based on the detected standard deviation in a frequency domain.

12. The probability density function separating apparatus as claimed in claim 8, wherein the standard deviation computing section computes the standard deviation in a frequency domain based on the spectrum in a frequency domain, and the random component computing section computes the probability density function in a frequency domain with the random component, based on the standard deviation in a frequency domain.

13. The probability density function separating apparatus as claimed in claim 12, wherein the random component computing section computes the probability density function in a time domain with the random component, based on the probability density function in a frequency domain with the random component.

14. The probability density function separating apparatus as claimed in claim 13, wherein the random component computing section includes:
a frequency domain computing section that computes the probability density function in a frequency domain with the random component; and
a time domain computing section that computes the probability density function in a time domain with the random component, by a) obtaining a function in a time domain from a real sequence of which a real part is the probability density function in a frequency domain with the random component and an imaginary part is zero, and b) extracting the square root of a sum of a square of the real part and a square of the imaginary part of the function in a time domain.

15. The probability density function separating apparatus as claimed in claim 14, wherein the time domain computing section includes:
a complex sequence computing section that is supplied with the probability density function in a frequency domain with the random component and computes the real sequence based on the probability density function; and
an inverse Fourier transform section that is supplied with the real sequence and supplies the real sequence to the time domain computing section.

16. The probability density function separating apparatus as claimed in claim 1, further comprising:
a peak to peak value detecting section that detects a peak to peak value of the probability density function based on the spectrum; and
a deterministic component computing section that computes a deterministic component of the given probability density function, based on the peak to peak value.

17. The probability density function separating apparatus as claimed in claim 16, wherein the peak to peak value detecting section detects the peak to peak value based on at least one null frequency of nulls that have the smallest absolute values of frequency selected from among a plurality of nulls included in the spectrum.

18. The probability density function separating apparatus as claimed in claim 17, wherein the deterministic component computing section computes a probability density function with a deterministic component in a time domain based on the peak to peak value.

19. The probability density function separating apparatus as claimed in claim 16, wherein the peak to peak value detecting section computes the peak to peak value based on a difference in frequency between any two nulls included in the spectrum.

20. The probability density function separating apparatus as claimed in claim 19, wherein the deterministic component computing section computes a probability density function with a deterministic component in a time domain based on the peak to peak value.

21. The probability density function separating apparatus as claimed in claim 16, wherein the deterministic component computing section computes a probability density function with a deterministic component in a time domain based on the peak to peak value.

22. The probability density function separating apparatus as claimed in claim 21, further comprising:
a random component computing section that computes a probability density function with a random component based on the standard deviation; and
a synthesizing section that generates a composite probability density function obtained by convolving the probability density function with the random component computed by the random component computing section and the probability density function with the deterministic component computed by the deterministic component computing section.

23. The probability density function separating apparatus as claimed in claim 22, wherein
the deterministic component computing section computes the deterministic component corresponding to each peak to peak value when sequentially changing peak to peak values using the peak to peak value detected by the peak to peak value detecting section as a reference, and
the synthesizing section sequentially generates a composite probability density function obtained by sequentially synthesizing a probability density function with each deterministic component and the probability density function with the random component, and
the probability density function separating apparatus further comprises:
a comparing section that compares each composite probability density function and the given probability density function, and selects either of the peak to peak values based on the comparison result.

24. The probability density function separating apparatus as claimed in claim 23, wherein
the peak to peak value detecting section computes the peak to peak value with predetermined measurement resolution, and
the deterministic component computing section computes the deterministic component corresponding to each peak to peak value in the case of sequentially changing the peak to peak values in a range according to the measurement resolution.

25. The probability density function separating apparatus as claimed in claim 21, wherein
the deterministic component computing section is previously supplied with a function of which the peak to peak value is unknown,
substitutes the peak to peak value detected by the peak to peak value detecting section into the function, and
computes the probability density function with the deterministic component.

26. The probability density function separating apparatus as claimed in claim 25, wherein
the deterministic component computing section is previously supplied with a plurality of functions according to the type of distribution of the deterministic component,
substitutes the peak to peak value detected by the peak to peak value detecting section into each function, and
respectively computes the probability density function for each type of distribution of a deterministic component.

27. The probability density function separating apparatus as claimed in claim 26, further comprising:
a synthesizing section that generates each composite probability density function obtained by convolving a probability density function of the random component computed by the random component computing section and each probability density function computed by the deterministic component computing section; and
a comparing section that compares each composite probability density function and the given probability density function, wherein the deterministic component computing section selects either of the respective probability density functions of the deterministic component based on the comparison result of the comparing section.

28. The probability density function separating apparatus as claimed in claim 1, further comprising:
a peak to peak value detecting section that compares respective probability densities of the given probability density function and a predetermined threshold value, detects a point where a magnitude relation between the respective probability densities and the predetermined threshold value changes, and detects a peak to peak value of the given probability density function based on the detected point; and
a deterministic component computing section that computes a deterministic component of the given probability density function based on the peak to peak value.

29. The probability density function separating apparatus as claimed in claim 28, wherein the peak to peak value detecting section sequentially changes the threshold value, detects the peak to peak value for respective threshold values, and selects either of the respective threshold values based on the change in the peak to peak value for the change in the threshold value.

30. The probability density function separating apparatus as claimed in claim 29, wherein
the peak to peak value detecting section compares the respective probability densities and the threshold value from both ends to a central portion of the given probability density function, and detects, to be the detected point, a point where the probability density becomes the threshold value or above from below the threshold value.

31. The probability density function separating apparatus as claimed in claim 28, wherein the peak to peak value detecting section compares the respective probability densities and the threshold value from both ends to a central portion of the given probability density function, and detects, to be the detected point, a point where the probability density becomes the threshold value or above from below the threshold value.

32. The probability density function separating apparatus as claimed in claim 1, further comprising:
a deterministic component computing section that compares a predetermined spectrum to a spectrum obtained by raising a spectrum in a frequency domain of the given probability density function to $\beta$th power, and computes a number of deterministic components included in the given probability density function based on the comparison result.

33. The probability density function separating apparatus as claimed in claim 32, wherein the deterministic component computing section detects $\beta$ of which each spectrum is substantially equal by sequentially changing the $\beta$, and computes an inverse of the detected $\beta$ as the number of the deterministic components.

34. A probability density function separating apparatus that separates a predetermined component in a given probability density function, comprising:
a domain transforming section that is supplied with the probability density function, and transforms the probability density function into a spectrum in a frequency domain; and a peak to peak value detecting section that detects a peak to peak value of the probability density function based on the spectrum.

35. The probability density function separating apparatus as claimed in claim 34, further comprising a deterministic component computing section that computes a deterministic component of the given probability density function, based on the peak to peak value.

36. A noise separating apparatus that separates a probability density function with a predetermined noise component from a probability density function of a signal under measurement, comprising:
   a domain transforming section that is supplied with the probability density function of the signal under measurement, and transforms the probability density function into a spectrum in a frequency domain; and
   a standard deviation computing section that computes standard deviation of a random noise component included in the probability density function, based on the spectrum.

37. The noise separating apparatus as claimed in claim 36, wherein the domain transforming section is supplied with a function showing probability by which the signal under measurement is likely to have an edge for each time, as the probability density function of the signal under measurement.

38. The noise separating apparatus as claimed in claim 36, wherein the domain transforming section is supplied with, for each amplitude value, a probability by which the signal under measurement is likely to have the amplitude value, as the probability density function of the signal under measurement.

39. The noise separating apparatus as claimed in claim 36, further comprising:
   a signal under measurement measuring section that samples the signal under measurement according to a given sampling signal, and computes the probability density function of the signal under measurement;
   a sampling signal measuring section that measures a probability density function of the sampling signal; and
   a correction section that corrects a value acquired by the standard deviation computing section or the peak to peak value detecting section, based on the probability density function of the sampling signal.

40. A noise separating apparatus that separates a probability density function with a predetermined noise component from a probability density function of a signal under measurement, comprising:
   a domain transforming section that is supplied with the probability density function of the signal under measurement, and transforms the probability density function into a spectrum in a frequency domain; and
   a peak to peak value detecting section that detects a peak to peak value of the probability density function, based on the spectrum.

41. The noise separating apparatus as claimed in claim 40, wherein
   the domain transforming section is supplied with a function showing probability by which the signal under measurement is likely to have an edge for each time, as the probability density function of the signal under measurement.

42. The noise separating apparatus as claimed in claim 40, wherein
   the domain transforming section is supplied with, for each amplitude value, a probability by which the signal under measurement is likely to have the amplitude value, as the probability density function of the signal under measurement.

43. The noise separating apparatus as claimed in claim 40, further comprising:
   a signal under measurement measuring section that samples the signal under measurement according to a given sampling signal, and computes the probability density function of the signal under measurement;
   a sampling signal measuring section that measures a probability density function of the sampling signal; and
   a correction section that corrects a value acquired by the standard deviation computing section or the peak to peak value detecting section, based on the probability density function of the sampling signal.

44. A test apparatus that tests a device under test, comprising:
   a noise separating apparatus that separates a probability density function of a predetermined noise component from a probability density function of a signal under measurement output from the device under test; and
   a deciding section that decides the good or bad of the device under test based on standard deviation of the predetermined noise component separated by the noise separating apparatus,
   wherein the noise separating apparatus includes:
      a domain transforming section that is supplied with the probability density function of the signal under measurement, and transforms the probability density function into a spectrum in a frequency domain; and
      a standard deviation computing section that computes standard deviation of a random noise component included in the probability density function, based on the spectrum.

45. A test apparatus that tests a device under test, comprising:
   a noise separating apparatus that separates a probability density function of a predetermined noise component from a probability density function of a signal under measurement output from the device under test; and
   a deciding section that decides the good or bad of the device under test based on standard deviation of the predetermined noise component separated by the noise separating apparatus and a peak to peak value of a deterministic noise component,
   wherein the noise separating apparatus includes:
      a domain transforming section that is supplied with the probability density function of the signal under measurement, and transforms the probability density function into a spectrum in a frequency domain; and
      a peak to peak value detecting section that detects a peak to peak value of the probability density function, based on the spectrum.

46. A non-transitory computer readable medium storing therein a program for testing a device under test, the program causes steps of:
   a noise separating step of separating standard deviation of a predetermined noise component from a probability density function of a signal under measurement output from the device under test; and
   a deciding step of deciding the good or bad of the device under test based on a probability density function of the predetermined noise component separated in the noise separating step,
   wherein the noise separating step includes:
      transforming the probability density function into a spectrum in a frequency domain, by being supplied with the probability density function of the signal under measurement; and computing standard deviation of a random noise component included in the probability density function, based on the spectrum.

47. A non-transitory computer readable medium storing therein a program for testing a device under test, the program causes steps of:
a noise separating step of separating a probability density function of a predetermined noise component from a probability density function of a signal under measurement output from the device under test; and
a deciding step of deciding the good or bad of the device under test based on standard deviation of the predetermined noise component separated in the noise separating step and a peak to peak value of a deterministic noise component,
wherein the noise separating step includes:
transforming the probability density function into a spectrum in a frequency domain, by being supplied with the probability density function of the signal under measurement; and
detecting a peak to peak value of the probability density function, based on the spectrum.

48. A computing apparatus that computes a Gaussian curve in a time domain from a Gaussian curve in a frequency domain, comprising:
a time domain computing section that computes the Gaussian curve in a time domain by a) acquiring a function in a time domain from a real sequence of which a real part is the Gaussian curve in a frequency domain and an imaginary part is zero, and b) extracting the square root of a sum of a square of the real part and a square of the imaginary part of the function in a time domain.

49. The computing apparatus as claimed in claim 48, wherein the time domain computing section includes an inverse Fourier transform section that is supplied with the real sequence, converts the real sequence into the function in a time domain, and supplies the function in a time domain to the time domain computing section.

50. The computing apparatus as claimed in claim 49, further comprising:
a complex sequence computing section that is supplied with the Gaussian curve in a frequency domain, computes the real sequence based on the Gaussian curve in a frequency domain, and supplies the real sequence to the inverse Fourier transform section.

51. The computing apparatus as claimed in claim 50, further comprising:
a frequency domain computing section that is supplied with standard deviation the Gaussian curve in a frequency domain, computes the Gaussian curve of the frequency domain based on the standard deviation, and supplies the Gaussian curve in the frequency domain to the complex sequence computing section.

52. A computing apparatus that computes a waveform in a time domain from a spectrum in a frequency domain, comprising:
a time domain computing section that computes the waveform in a time domain by a) acquiring a magnitude spectrum of the frequency domain, and b) transforming the magnitude spectrum into a function in a time domain
wherein the time domain computing section computes the waveform in a time domain by extracting the square root of a sum of a square of a real part and a square of an imaginary part of the function in a time domain obtained by transforming the magnitude spectrum.

53. The computing apparatus as claimed in claim 52, wherein the time domain computing section is supplied with a continuously changing spectrum as the magnitude spectrum of the frequency domain.

54. The computing apparatus as claimed in claim 53, wherein the time domain computing section is supplied with a spectrum of a Gaussian curve as the magnitude spectrum of the frequency domain.

55. The computing apparatus as claimed in claim 52, further comprising:
a frequency domain measuring section that detects the magnitude spectrum of a given signal under measurement, and supplies the magnitude spectrum to the time domain computing section, wherein the time domain computing section computes a waveform in a time domain of the signal under measurement.

56. A non-transitory computer readable medium storing therein a program for computing a waveform in a time domain from a spectrum in a frequency domain, the program causes steps of:
computing the waveform in a time domain by a) acquiring a magnitude spectrum of the frequency domain, and b) transforming the magnitude spectrum into a function in a time domain,
wherein the time domain computing section computes the waveform in a time domain by extracting the square root of a sum of a square of a real part and a square of an imaginary part of the function in a time domain obtained by transforming the magnitude spectrum.

57. A non-transitory computer readable medium storing therein a program that causes, to function, a probability density function separating apparatus that separates a predetermined component in a given probability density function, the program causing the probability density function separating apparatus to function as:
a domain transforming section that is supplied with the probability density function and transforms the probability density function into a spectrum in a frequency domain; and
a standard deviation computing section that computes standard deviation of a random component included in the probability density function based on the spectrum.

58. A non-transitory computer readable medium storing therein a program that causes, to function, a probability density function separating apparatus that separates a predetermined component in a given probability density function, the program causing the probability density function separating apparatus to function as:
a domain transforming section that is supplied with the probability density function and transforms the probability density function into a spectrum in a frequency domain;
a peak to peak value detecting section that detects a peak to peak value of the probability density function based on the spectrum; and
a deterministic component computing section that computes a deterministic component of the given probability density function, based on the peak to peak value.

59. A non-transitory computer readable medium storing therein a program that causes, to function, a noise separating apparatus that separates a probability density function with a predetermined noise component from a probability density function of a signal under measurement, the program causing the noise separating apparatus to function as:
a domain transforming section that is supplied with the probability density function of the signal under measurement, and transforms the probability density function into a spectrum in a frequency domain; and a standard deviation computing section that computes standard deviation of a random noise component included in the probability density function, based on the spectrum.

60. A non-transitory computer readable medium storing therein a program that causes, to function, a noise separating apparatus that separates a probability density function with a predetermined noise component from a probability density function of a signal under measurement, the program causing the noise separating apparatus to function as:

a domain transforming section that is supplied with the probability density function of the signal under measurement, and transforms the probability density function into a spectrum in a frequency domain;

a peak to peak value detecting section that detects a peak to peak value of the probability density function based on the spectrum; and a deterministic component computing section that computes a probability density function of a deterministic noise component, based on the peak to peak value.

61. A non-transitory computer readable medium storing therein a program that causes, to function, a computing apparatus that computes a Gaussian curve in a time domain from a Gaussian curve in a frequency domain, the program causing the computing apparatus to function as:

a time domain computing section that computes the Gaussian curve in a time domain by a) acquiring a function in a time domain from a real sequence of which a real part is the Gaussian curve in a frequency domain and an imaginary part is zero, and b) extracting the square root of a sum of a square of the real part and a square of the imaginary part of the function in a time domain.

62. A non-transitory computer readable medium storing therein a program that causes, to function, a computing apparatus that computes a waveform in a time domain from a spectrum in a frequency domain, the program causing the computing apparatus to function as:

a time domain computing section that computes the waveform in a time domain by a) acquiring a magnitude spectrum of the frequency domain, and b) transforming the magnitude spectrum into a function in a time domain.

* * * * *